US012514019B2

(12) United States Patent
Maeda et al.

(10) Patent No.: US 12,514,019 B2
(45) Date of Patent: Dec. 30, 2025

(54) SOLID-STATE IMAGING ELEMENT AND ELECTRONIC DEVICE

(71) Applicant: SONY SEMICONDUCTOR SOLUTIONS CORPORATION, Kanagawa (JP)

(72) Inventors: Shuhei Maeda, Kanagawa (JP); Takashi Tanaka, Kanagawa (JP); Hironobu Fukui, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 379 days.

(21) Appl. No.: 18/255,267

(22) PCT Filed: Nov. 25, 2021

(86) PCT No.: PCT/JP2021/043102

§ 371 (c)(1),
(2) Date: May 31, 2023

(87) PCT Pub. No.: WO2022/124086

PCT Pub. Date: Jun. 16, 2022

(65) Prior Publication Data

US 2024/0006452 A1 Jan. 4, 2024

(30) Foreign Application Priority Data

Dec. 8, 2020 (JP) ................................ 2020-203494

(51) Int. Cl.
*H10F 39/00* (2025.01)

(52) U.S. Cl.
CPC .......... *H10F 39/811* (2025.01); *H10F 39/011* (2025.01); *H10F 39/809* (2025.01)

(58) Field of Classification Search
None
See application file for complete search history.

(56) References Cited

U.S. PATENT DOCUMENTS

2019/0057997 A1* 2/2019 Togashi ............... H10D 64/513
2022/0181364 A1* 6/2022 Miyake ............. H10F 39/80373
2023/0187463 A1* 6/2023 Park .................... H10F 39/8037 257/291

FOREIGN PATENT DOCUMENTS

JP 2006-108466 A 4/2006
JP 2010-245506 A 10/2010
(Continued)

OTHER PUBLICATIONS

International Search Report and Written Opinion of PCT Application No. PCT/JP2021/043102, issued on Mar. 1, 2022, 08 pages of ISRWO.

*Primary Examiner* — Benjamin P Sandvik
(74) *Attorney, Agent, or Firm* — CHIP LAW GROUP

(57) ABSTRACT

A solid-state imaging element according to an aspect of the present disclosure includes a first semiconductor substrate (11), an insulating layer (46) and a second semiconductor substrate (21), a floating diffusion layer (FD) of the first semiconductor substrate (11), a transfer gate (TG) of the first semiconductor substrate (11), a first through wire (71) electrically connected to the floating diffusion layer (FD) and penetrating the insulating layer (46) and the second semiconductor substrate (21), a second through wire (72) electrically connected to the transfer gate (TG) and penetrating the insulating layer (46) and the second semiconductor substrate (21), a wiring layer (56) stacked on the second semiconductor substrate (21) and having a wiring electrically connected to the first through wire (71) or the second through wire (72), and an adjustment layer that is provided on the second semiconductor substrate (21) so as to be in contact with both or one of the first through wire (71) and the second through wire (72) and adjusts a capacitance between the transfer gate (TG) and the floating diffusion layer (FD).

10 Claims, 21 Drawing Sheets

(56) References Cited

FOREIGN PATENT DOCUMENTS

| | | | |
|---|---|---|---|
| JP | 2018-026434 | A | 2/2018 |
| WO | 2017/138197 | A1 | 8/2017 |

* cited by examiner

SOLID-STATE IMAGING ELEMENT AND ELECTRONIC DEVICE

CROSS REFERENCE TO RELATED APPLICATIONS

This application is a U.S. National Phase of International Patent Application No. PCT/JP2021/043102 filed on Nov. 25, 2021, which claims priority benefit of Japanese Patent Application No. JP 2020-203494 filed in the Japan Patent Office on Dec. 8, 2020. Each of the above-referenced applications is hereby incorporated herein by reference in its entirety.

FIELD

The present disclosure relates to a solid-state imaging element and an electronic device.

BACKGROUND

In recent years, in order to achieve downsizing of a solid-state imaging element and densification of pixels, a solid-state imaging element having a three-dimensional structure has been developed. In the solid-state imaging element having the three-dimensional structure, for example, a semiconductor substrate having a plurality of sensor pixels and a semiconductor substrate having a signal processing circuit that processes a signal obtained by each sensor pixel are stacked on each other (see, for example, Patent Literature 1).

The first layer of the solid-state imaging element is provided with a photodiode (PD), a floating diffusion (FD), a transfer gate (TG) that is a gate electrode of a transfer transistor, and the like. Normally, signal lines such as control lines are drawn out from the first layer to the upper side of the second layer by a through contact, and are arranged in the second and subsequent layers. In order to maintain uniformity of capacitance between the transfer gate TG and the floating diffusion FD, that is, TG-FD capacitance, for each pixel, optimization of TG wiring and FD wiring is performed in the second and subsequent layers.

CITATION LIST

Patent Literature

Patent Literature 1: JP 2010-245506 A

SUMMARY

Technical Problem

However, as the number of signal lines becomes larger and the pixel pitch becomes finer, the degree of freedom in wiring of the second and subsequent layers decreases. Further, since the signal lines are drawn out in the second and subsequent layers, this leads to an increase in the number of wiring layers in the second and subsequent layers. Thus, it is difficult to adjust the TG-FG capacitance while suppressing an increase in the number of wiring layers.

Accordingly, the present disclosure provides a solid-state imaging element and an electronic device capable of facilitating adjustment of capacitance between a transfer gate and a floating diffusion while suppressing an increase in the number of wiring layers.

Solution to Problem

A solid-state imaging element according to an aspect of the present disclosure includes a first semiconductor substrate; a second semiconductor substrate stacked on the first semiconductor substrate with an insulating layer interposed therebetween; a photoelectric conversion element that is provided on the first semiconductor substrate and generates charge by photoelectric conversion; a floating diffusion layer that is provided on the first semiconductor substrate and retains the charge generated by the photoelectric conversion element; a transfer gate that is a gate electrode of a transfer transistor that is provided on the first semiconductor substrate and transfers the charge generated by the photoelectric conversion element to the floating diffusion layer; a first through wire electrically connected to the floating diffusion layer and penetrating the insulating layer and the second semiconductor substrate; a second through wire electrically connected to the transfer gate and penetrating the insulating layer and the second semiconductor substrate; a wiring layer stacked on the second semiconductor substrate and having a wiring electrically connected to the first through wire or the second through wire; and an adjustment layer that is provided on the second semiconductor substrate so as to be in contact with both or one of the first through wire and the second through wire and adjusts a capacitance between the transfer gate and the floating diffusion layer.

DESCRIPTION OF EMBODIMENTS

Hereinafter, embodiments of the present disclosure will be described in detail with reference to the drawings. Note that the solid-state imaging element and the electronic device according to the present disclosure are not limited by this embodiment. Further, in each of the following embodiments, basically the same parts are denoted by the same reference signs, and redundant description is omitted.

One or more embodiments (examples and modifications) described below can each be implemented independently. On the other hand, at least some of the plurality of embodiments described below may be appropriately combined with at least some of other embodiments. The plurality of embodiments may include novel features different from each other. Therefore, the plurality of embodiments can contribute to solving different objects or problems, and can exhibit different effects. Note that the effects in the embodiments are merely examples and are not limited, and other effects may be provided.

The present disclosure will be described according to the following order of items.

1. First Embodiment
1-1. Example of Schematic Configuration of Solid-State Imaging Element
1-2. Example of Pixel Circuit
1-3. Example of Connection Mode of Pixel Circuit
1-4. Example of Cross-Sectional Configuration of Solid-State Imaging Element
1-5. Example of Layer Structure of Solid-State Imaging Element
1-6. Modification of Layer Structure of Solid-State Imaging Element
1-7. Example of Method of Manufacturing Solid-State Imaging Element
1-8. Effects
2. Second embodiment
2-1. Example of Layer Structure of Solid-State Imaging Element
2-2. Modification of Layer Structure of Solid-State Imaging Element
2-3. Effects
3. Third embodiment
3-1. Example of Layer Structure of Solid-State Imaging Element
3-2. Effects
4. Fourth embodiment
4-1. Example of Layer Structure of Solid-State Imaging Element
4-2. Effects
5. Other Embodiments
6. Application Example
7. Application Example
7-1. Vehicle Control System
7-2. Operating Room System
8. Appendix

1. First Embodiment

1-1. Example of Schematic Configuration of Solid-State Imaging Element

Figure 1:
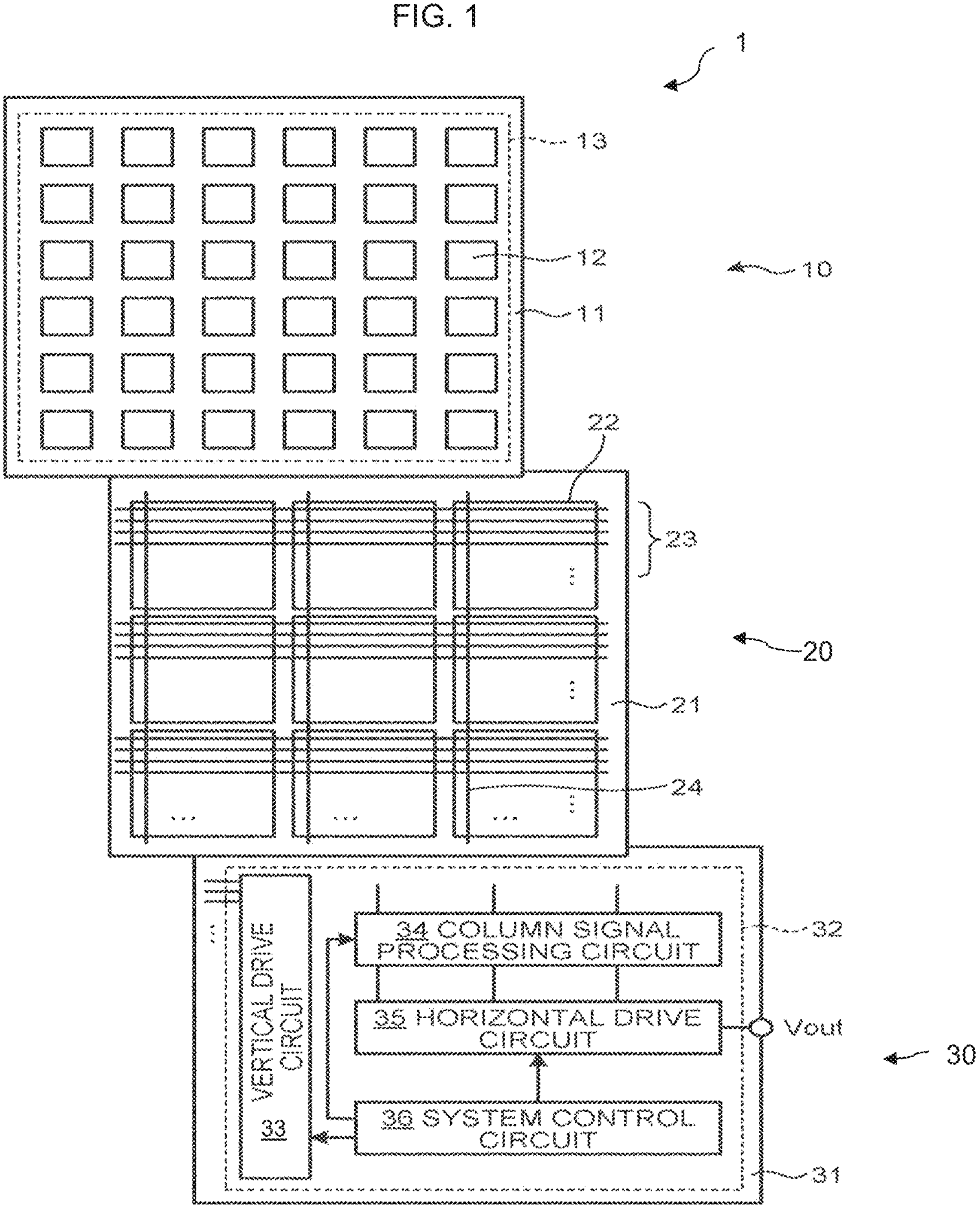
FIG. 1 is a diagram illustrating an example of a schematic configuration of a solid-state imaging element according to a first embodiment.

An example of a schematic configuration of a solid-state imaging element 1 according to a first embodiment will be described with reference to FIG. 1. FIG. 1 is a diagram illustrating an example of the schematic configuration of the solid-state imaging element 1 according to the first embodiment. Examples of the solid-state imaging element 1 include a complementary metal oxide semiconductor (CMOS) image sensor and the like.

As illustrated in FIG. 1, the solid-state imaging element 1 includes three substrates, that is, a first substrate 10, a second substrate 20, and a third substrate 30. The structure of the solid-state imaging element 1 is a three-dimensional structure formed by bonding three substrates of the first substrate 10, the second substrate 20, and the third substrate 30. The first substrate 10, the second substrate 20, and the third substrate 30 are stacked in this order. The first substrate 10 is a first layer, the second substrate 20 is a second layer, and the third substrate 30 is a third layer.

The first substrate 10 includes a first semiconductor substrate 11 and a plurality of sensor pixels 12 that performs photoelectric conversion. The first semiconductor substrate 11 has the sensor pixels 12. These sensor pixels 12 are provided in a matrix (two-dimensional array) in the pixel region 13 of the first substrate 10.

The second substrate 20 includes a second semiconductor substrate 21, readout circuits 22 that output pixel signals, a plurality of pixel drive lines 23 extending in a row direction, and a plurality of vertical signal lines 24 extending in a column direction. The second semiconductor substrate 21 has one readout circuit 22 for every four sensor pixels 12. The readout circuit 22 outputs a pixel signal based on charge output from the sensor pixel 12.

The third substrate 30 includes a third semiconductor substrate 31 and a logic circuit 32 that processes the pixel signal. The third semiconductor substrate 31 has the logic circuit 32. The logic circuit 32 includes, for example, a vertical drive circuit 33, a column signal processing circuit 34, a horizontal drive circuit 35, and a system control circuit 36.

The logic circuit 32 outputs an output voltage Vout for each sensor pixel 12 to the outside. Note that, in the logic circuit 32, for example, a low resistance region including silicide formed using a self aligned silicide process such as $CoSi_2$ or NiSi may be formed on a surface of an impurity diffusion region in contact with the source electrode and the drain electrode.

For example, the vertical drive circuit 33 sequentially selects the plurality of sensor pixels 12 row by row.

The column signal processing circuit 34 performs, for example, correlated double sampling (CDS) processing on the pixel signal output from each sensor pixel 12 of the row selected by the vertical drive circuit 33. For example, the column signal processing circuit 34 extracts the signal level of each pixel signal by executing the CDS processing, and holds pixel data corresponding to the amount of light received by each sensor pixel 12.

For example, the horizontal drive circuit 35 sequentially outputs the pixel data held in the column signal processing circuit 34 to the outside.

The system control circuit 36 controls driving of each block (the vertical drive circuit 33, the column signal processing circuit 34, and the horizontal drive circuit 35) in the logic circuit 32, for example.

1-2. Example of Pixel Circuit

Figure 2:
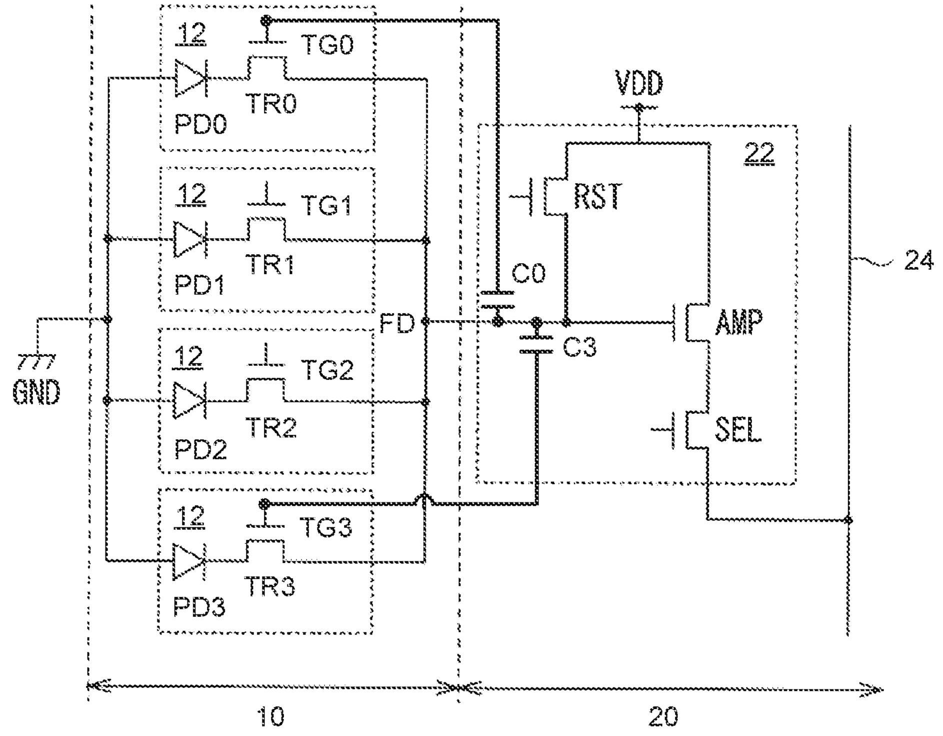
FIG. 2 is a diagram illustrating an example of a pixel circuit according to the first embodiment.

Next, an example of a pixel circuit according to the first embodiment will be described with reference to FIG. 2. FIG. 2 is a diagram illustrating an example of a pixel circuit according to the first embodiment.

As illustrated in FIG. 2, the four sensor pixels 12 share one readout circuit 22. Here, "sharing" indicates that the four sensor pixels 12 are electrically connected to the common readout circuit 22, that is, outputs of the four sensor pixels 12 are input to the common readout circuit 22.

Each sensor pixel 12 has common components. In FIG. 2, in order to distinguish the components of each sensor pixel 12 from each other, an identification number (0, 1, 2, and 3) is added to the end of a reference sign of a component of each sensor pixel 12. Hereinafter, when it is necessary to distinguish the components of each sensor pixel 12 from each other, the identification number is added to the end of a reference sign of a component of each sensor pixel 12, but when it is not necessary to distinguish the components of each sensor pixel 12 from each other, the identification number at the end of a reference sign of a component of each sensor pixel 12 is omitted.

Each of the sensor pixels 12 includes, for example, a photodiode PD and a transfer transistor TR electrically connected to the photodiode PD. These sensor pixels 12 share a floating diffusion FD electrically connected to each transfer transistor TR. That is, the individual photodiode PD of each sensor pixel 12 is electrically connected to the floating diffusion FD via the transfer transistor TR. For example, the photodiode PD, the transfer transistor TR, the floating diffusion FD, and so on are provided on the first substrate 10.

The photodiode PD performs photoelectric conversion to generate charge corresponding to the amount of received light. A cathode of the photodiode PD is electrically connected to a source of the transfer transistor TR. Further, an anode of the photodiode PD is electrically connected to a reference potential line (for example, ground). The photodiode PD is an example of a photoelectric conversion element.

The transfer transistor TR is electrically connected between the photodiode PD and the floating diffusion FD. In the transfer transistor TR, for example, a drain is electrically connected to the floating diffusion FD, and a transfer gate TG as a gate is electrically connected to the pixel drive line 23 (see FIG. 1). When the transfer transistor TR is turned on according to a drive signal input to the gate, the transfer transistor TR transfers charge of the photodiode PD to the floating diffusion FD. The transfer transistor TR is, for example, a CMOS transistor.

The floating diffusion FD is common to the sensor pixels 12 sharing one readout circuit 22, and is electrically connected to an input end of the readout circuit 22 common to the sensor pixels 12. The floating diffusion FD temporarily holds the charge output from the photodiode PD and input via the transfer transistor TR. The floating diffusion FD is an example of a floating diffusion layer.

Here, in the transfer transistor TR0, a capacitance C0 is added between the transfer gate TG0 and the floating diffusion FD. Further, in the transfer transistor TR3, a capacitance C3 is added between the transfer gate TG3 and the floating diffusion FD. By adjusting these capacitances C0 and C3, for example, individual capacitances (TG-FD capacitances) between the transfer gates TG (TG0 to TG3) and the floating diffusion FD are made uniform. This capacitance adjustment will be described in detail later.

The readout circuit 22 includes, for example, a reset transistor RST, a selection transistor SEL, and an amplification transistor AMP. The reset transistor RST, the selection transistor SEL, the amplification transistor AMP, and the like are provided on the second substrate 20, for example. The reset transistor RST, the amplification transistor AMP, and the selection transistor SEL are, for example, CMOS transistors.

The reset transistor RST is a transistor for resetting potential. In the reset transistor RST, for example, a drain is electrically connected to a power supply line VDD, and a source is electrically connected to the floating diffusion FD. Further, a gate is electrically connected to the pixel drive line 23 (see FIG. 1). When the reset transistor RST is turned on according to a drive signal input to the gate, the reset transistor RST resets potential of the floating diffusion FD to potential of the power supply line VDD.

The amplification transistor AMP is a transistor for voltage amplification. In the amplification transistor AMP, for example, a drain is electrically connected to the power supply line VDD, and a gate is electrically connected to the floating diffusion FD. The amplification transistor AMP amplifies the potential of the floating diffusion FD, and generates a voltage corresponding to amplified potential as a pixel signal.

The selection transistor SEL is a transistor for pixel selection. In the selection transistor SEL, for example, a drain is electrically connected to a source of the amplification transistor AMP, and a source is electrically connected to the vertical signal line 24. Further, a gate is electrically connected to the pixel drive line 23 (see FIG. 1). When the selection transistor SEL is turned on according to a drive signal input to the gate, the selection transistor SEL determines the sensor pixel 12 from which the pixel signal is to be read. That is, the selection transistor SEL controls the output timing of the pixel signal from the readout circuit 22.

Note that the configuration of the readout circuit 22 is not particularly limited. For example, the selection transistor SEL may be provided between the power supply line VDD and the amplification transistor AMP. Further, one or more of the reset transistor RST, the amplification transistor AMP, the selection transistor SEL, and the like can be omitted depending on the method of reading the pixel signal, or another transistor can be added.

1-3. Example of Connection Mode of Pixel Circuit

Figure 3:
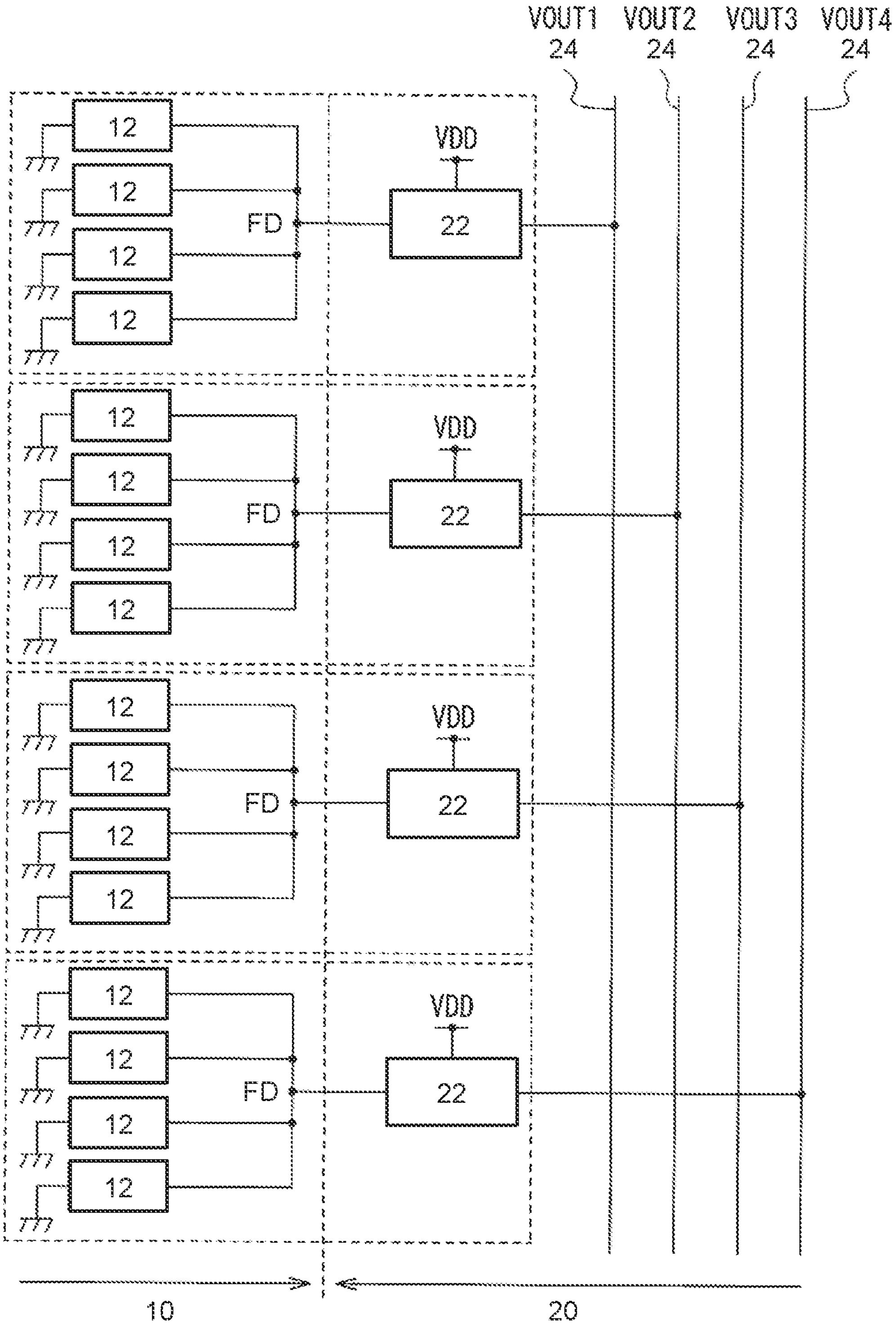
FIG. 3 is a diagram illustrating an example of a connection mode of the pixel circuit according to the first embodiment.

An example of a connection mode of the pixel circuit according to the first embodiment will be described with reference to FIG. 3. FIG. 3 is a diagram illustrating an example of the connection mode of the pixel circuit according to the first embodiment.

As illustrated in FIG. 3, the plurality of readout circuits 22 is arranged, for example, side by side in an extending direction (for example, the column direction) of the vertical signal line 24. One of these readout circuits 22 is allocated to each vertical signal line 24. In the example of FIG. 3, the number of vertical signal lines 24 is four, and the number of readout circuits 22 is four. Four sensor pixels 12 are electrically connected to one readout circuit 22. That is, the four sensor pixels 12 share the floating diffusion FD.

Figure 4:
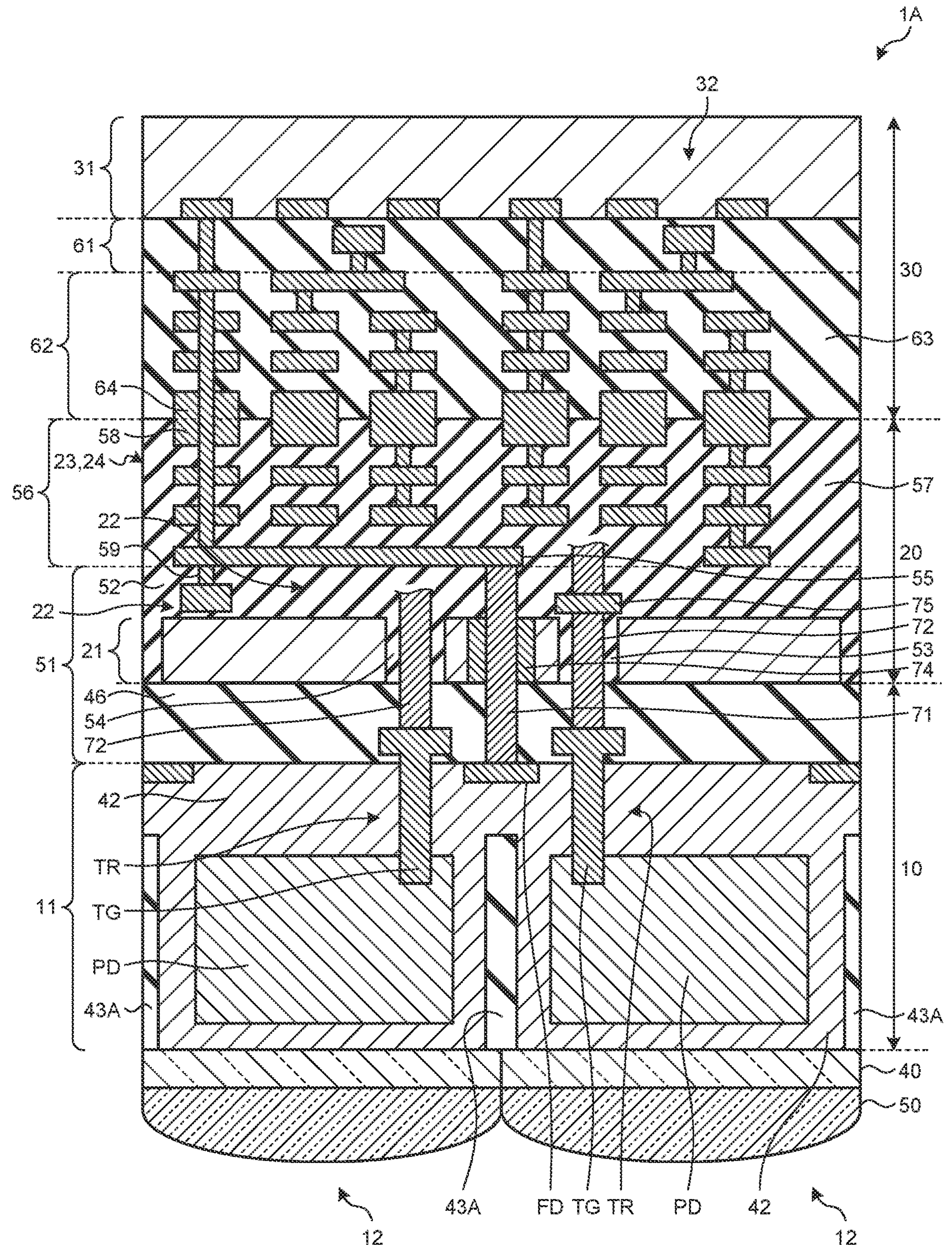
FIG. 4 is a diagram illustrating an example of a longitudinal cross-sectional configuration of the solid-state imaging element according to the first embodiment.

1-4. Example of Cross-Sectional Configuration of Solid-State Imaging Element An example of a cross-sectional configuration of the solid-state imaging element 1 according to the first embodiment will be described with reference to FIG. 4. FIG. 4 is a diagram illustrating an example of a longitudinal cross-sectional configuration (cross-sectional configuration in a vertical direction) of the solid-state imaging element 1 according to the first embodiment.

As illustrated in FIG. 4, the solid-state imaging element 1 is formed by stacking the first substrate 10, the second substrate 20, and the third substrate 30 in this order. The solid-state imaging element 1 includes a color filter 40 and a light receiving lens 50 on a back surface side (light incident surface side) of the first substrate 10, and is formed as a back surface irradiation type.

The first substrate 10 is formed by stacking an insulating layer 46 on the first semiconductor substrate (semiconductor layer) 11. The first substrate 10 includes the insulating layer 46 as a part of an interlayer insulating film 51. The insulating layer 46 is provided in a gap between the first semiconductor substrate 11 and a second semiconductor substrate 21 described later.

The first semiconductor substrate 11 includes a silicon substrate. The first semiconductor substrate 11 has, for example, a p-well layer 42 in a part of a front surface and in the vicinity thereof, and has the photodiode PD of a conductivity type different from that of the p-well layer 42 in another region (region deeper than the p-well layer 42). The p-well layer 42 includes a p-type semiconductor region. The photodiode PD includes a semiconductor region of a conductivity type (specifically, n-type) different from that of the p-well layer 42. Further, the first semiconductor substrate 11 includes, in the p-well layer 42, the floating diffusion FD as a semiconductor region of a conductivity type (specifically, n type) different from that of the p-well layer 42. The floating diffusion FD is formed in the p-well layer 42, and is one floating diffusion layer common to the four adjacent sensor pixels 12.

The first substrate 10 includes the photodiode PD and the transfer transistor TR in each sensor pixel 12, and further includes the floating diffusion FD in each of the four sensor pixels 12. The transfer transistor TR and the floating diffusion FD are provided in a portion on the front surface side (side opposite to the light incident surface side, the second substrate 20 side) of the first semiconductor substrate 11.

The first substrate 10 further includes an element isolation section 43 that separates each sensor pixel 12. The element isolation section 43 is formed so as to extend in a normal direction of the first semiconductor substrate 11 (direction perpendicular to the front surface of the first semiconductor substrate 11). The element isolation section 43 is provided between two sensor pixels 12 adjacent to each other. The element isolation section 43 electrically isolates the sensor pixels 12 adjacent to each other from each other. The element isolation section 43 is formed by, for example, silicon oxide. The element isolation section 43 is, for example, an isolation section of deep trench isolation (DTI) type in which a trench is formed from a back surface to middle of the first semiconductor substrate 11.

The color filter 40 is provided on the back surface side of the first semiconductor substrate 11. The color filter 40 is provided, for example, at a position in contact with the back surface of the first semiconductor substrate 11 and facing the sensor pixel 12. The light receiving lens 50 is, for example, in contact with a back surface of the color filter 40 and is provided at a position facing the sensor pixel 12 via the color filter 40. One color filter 40 and one light receiving lens 50 are provided for each sensor pixel 12.

The second substrate 20 is formed by stacking an insulating layer 52 on a semiconductor substrate (semiconductor layer) 21. The second substrate 20 includes the insulating layer 52 as a part of the interlayer insulating film 51. The insulating layer 52 is provided in a gap between the second semiconductor substrate 21 and a third semiconductor substrate 31 described later. The second semiconductor substrate 21 includes a silicon substrate.

The second substrate 20 includes one readout circuit 22 for every four sensor pixels 12 (see FIGS. 2 and 3). The readout circuit 22 is provided in a portion on the front surface side (third substrate 30 side) of the second semiconductor substrate 21. The second substrate 20 is bonded to the first substrate 10 with a back surface of the second semiconductor substrate 21 facing the front surface side of the first semiconductor substrate 11. That is, the second substrate 20 is bonded to the first substrate 10 in a face-to-back manner.

The second substrate 20 further includes a plurality of insulating layers 53 and 54 penetrating the second semiconductor substrate 21 in the same layer as the second semiconductor substrate 21. These insulating layers 53 and 54 are provided on the second substrate 20 as a part of the interlayer insulating film 51.

A stacked body including the first substrate 10 and the second substrate 20 includes an interlayer insulating film 51, a plurality of through wires 71 and 72, a diffusion layer (floating diffusion layer) 74, and a gate layer 75.

Each of the through wires 71 and 72 is provided in the interlayer insulating film 51, extends in a normal direction of the second semiconductor substrate 21, and penetrates the second semiconductor substrate 21. Each of the through wires 71 and 72 is referred to as a through contact. The first substrate 10 and the second substrate 20 are electrically connected to each other by the through wires 71 and 72. As the through wires 71 and 72, for example, a first through wire 71 for the floating diffusion FD (FD1 to FD4) and a plurality of second through wires 72 for the transfer gate TG (TG0 to TG3) exist. Each of the second through wires 72 penetrates the insulating layers 53 and 54.

The diffusion layer 74 is provided in the same layer as the second semiconductor substrate 21 so as to be in contact with the first through wire 71, and is electrically connected to the first through wire 71. The gate layer 75 is provided on the second semiconductor substrate 21 so as to be in contact with the second through wire 72 without being in contact with the diffusion layer 74, and is electrically connected to the second through wire 72. The diffusion layer 74 and the gate layer 75 function as an adjustment layer that adjusts the capacitance between the transfer gate TG and the floating diffusion FD, that is, the TG-FD capacitance.

The second substrate 20 further includes a plurality of connection sections 59 electrically connected to the readout circuit 22 and the second semiconductor substrate 21 in the insulating layer 52. Furthermore, the second substrate 20 includes, for example, a wiring layer 56 on the insulating layer 52.

The wiring layer 56 includes, for example, an insulating layer 57, and a plurality of pixel drive lines 23 and a plurality of vertical signal lines 24 provided in the insulating layer 57. Furthermore, the wiring layer 56 includes a connection wiring 55 in the insulating layer 57 for each floating diffusion FD. The connection wiring 55 is electrically connected to the first through wire 71 connected to the floating diffusion FD. Any of the pixel drive lines 23 is electrically connected to the second through wire 72 connected to the transfer gate TG. The pixel drive line 23, the vertical signal line 24, the connection wiring 55, and the like are examples of wirings.

The wiring layer 56 further includes, for example, a plurality of pad electrodes 58 in the insulating layer 57. Each pad electrode 58 is formed by metal such as copper (Cu) or aluminum (Al), for example. Each pad electrode 58 is exposed on the surface of the wiring layer 56. Each pad electrode 58 is used for electrical connection between the second substrate 20 and the third substrate 30 and bonding between the second substrate 20 and the third substrate 30. For example, one pad electrode 58 is provided for each of the pixel drive lines 23 and the vertical signal lines 24.

The third substrate 30 is formed by stacking an interlayer insulating film 61 on a semiconductor substrate (semiconductor layer) 31, for example. The third semiconductor substrate 31 includes a silicon substrate. Note that the third substrate 30 is bonded to the second substrate 20 through surfaces on the front surface sides of each other, and thus the vertical description is opposite to the vertical direction in the drawings when the configuration in the third substrate 30 is described.

The third substrate 30 has a configuration in which the logic circuit 32 is provided in a portion on a front surface side of the third semiconductor substrate 31. The third substrate 30 includes, for example, a wiring layer 62 on the interlayer insulating film 61. The wiring layer 62 includes, for example, an insulating layer 63 and a plurality of pad electrodes 64 provided in the insulating layer 63. Each pad electrode 64 is electrically connected to the logic circuit 32. Each pad electrode 64 is formed by, for example, Cu (copper). Each pad electrode 64 is exposed on a front surface of the wiring layer 62. Each pad electrode 64 is used for electrical connection between the second substrate 20 and the third substrate 30 and bonding between the second substrate 20 and the third substrate 30. Note that the number of pad electrodes 64 is not necessarily plural.

The third substrate 30 and the second substrate 20 are electrically connected to each other by bonding the pad electrodes 58 and 64 to each other. The third substrate 30 is bonded to the second substrate 20 with the front surface of the third semiconductor substrate 31 facing the front surface side of the second semiconductor substrate 21. That is, the third substrate 30 is bonded to the second substrate 20 in a face-to-face manner.

1-5. Example of Layer Structure of Solid-State Imaging Element

Figure 5:
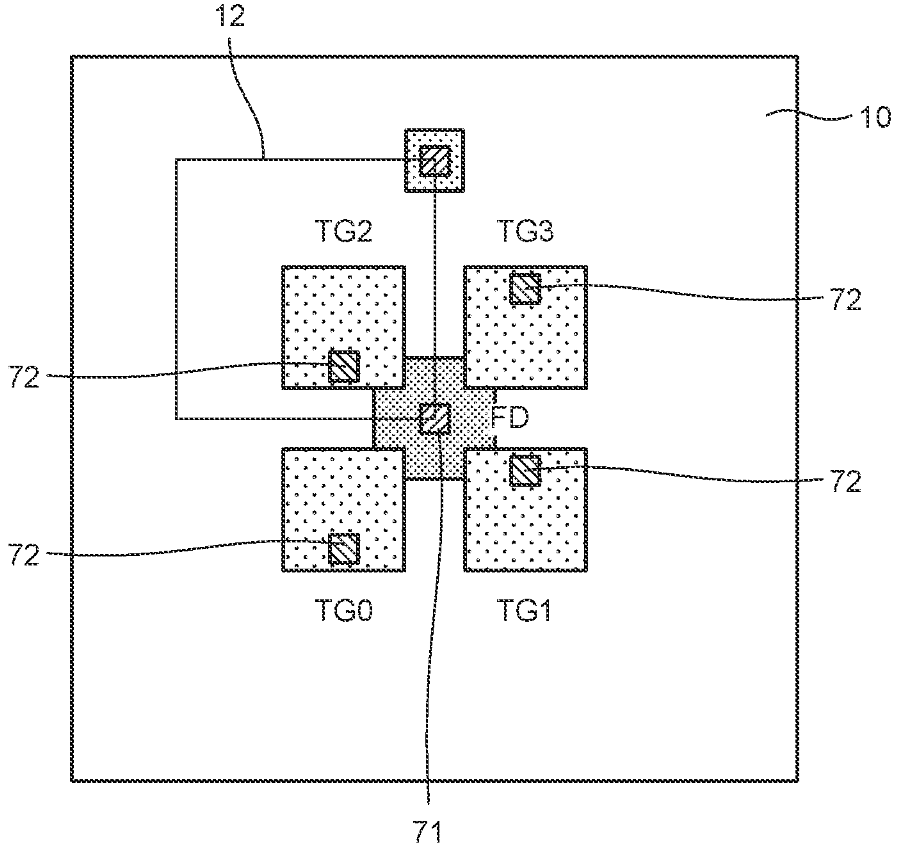
FIG. 5 is a plan view illustrating an example of a schematic configuration of a first layer of the solid-state imaging element according to the first embodiment.
Figure 6:
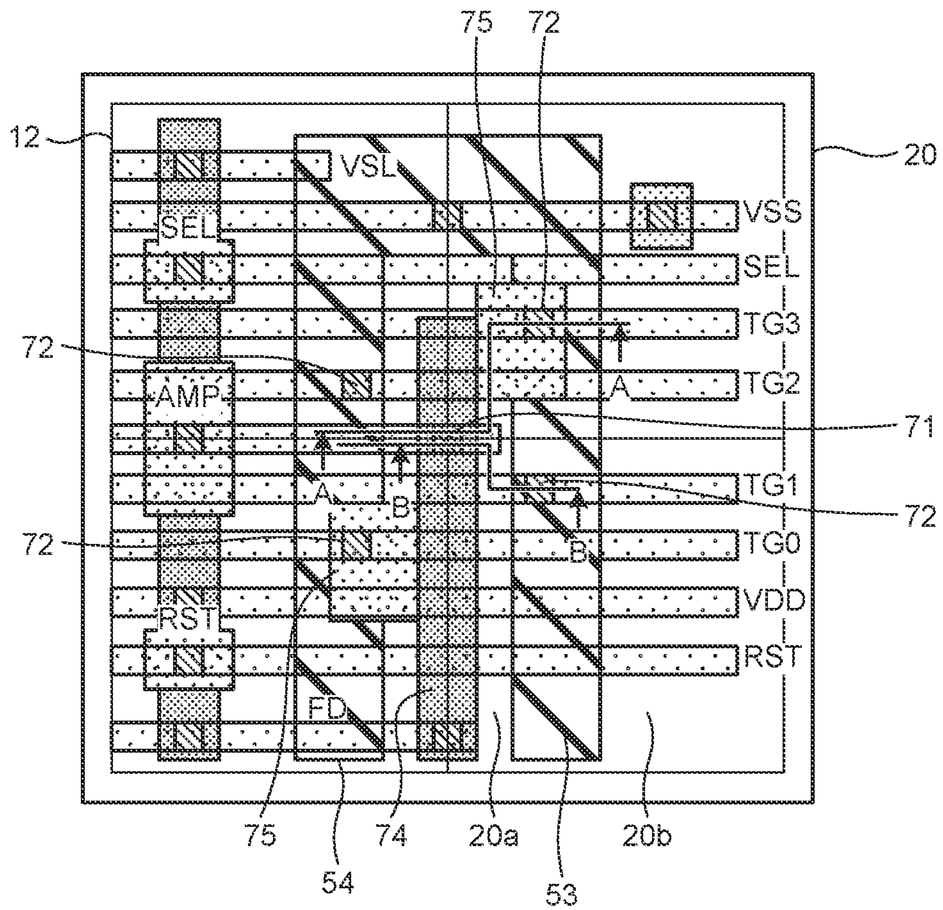
FIG. 6 is a plan view illustrating an example of a schematic configuration of a second layer and a wiring layer of the solid-state imaging element according to the first embodiment.
Figure 7:
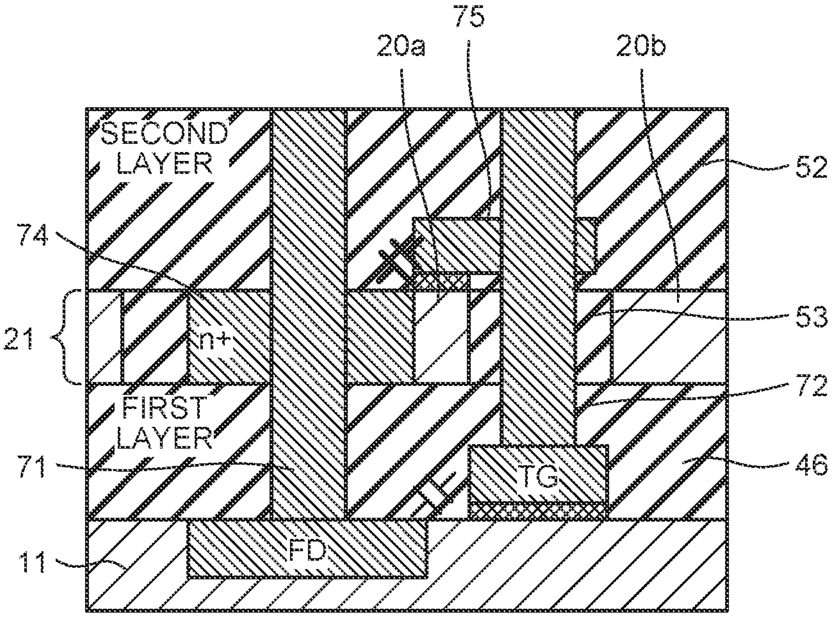
FIG. 7 is a cross-sectional view illustrating the first layer and the second layer of the solid-state imaging element according to the first embodiment taken along line A-A in FIG. 6.
Figure 8:
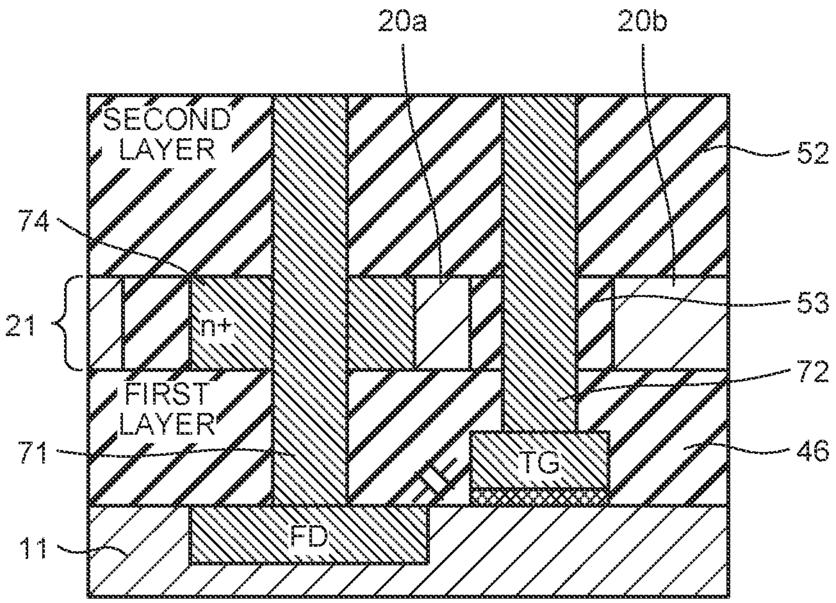
FIG. 8 is a cross-sectional view illustrating the first layer and the second layer of the solid-state imaging element according to the first embodiment taken along line B-B in FIG. 6.

An example of a layer structure of the solid-state imaging element 1 according to the first embodiment will be described with reference to FIGS. 5 to 8. FIG. 5 is a plan view illustrating an example of a schematic configuration of the first layer of the solid-state imaging element 1 according to the first embodiment. FIG. 6 is a plan view illustrating an example of a schematic configuration of the second layer and the wiring layer of the solid-state imaging element 1 according to the first embodiment. FIG. 7 is a cross-sectional view illustrating the first layer and the second layer of the solid-state imaging element 1 according to the first embodiment taken along line A-A in FIG. 6. FIG. 8 is a cross-sectional view illustrating the first layer and the second layer of the solid-state imaging element 1 according to the first embodiment taken along line B-B in FIG. 6.

As illustrated in FIG. 5, in the first layer (first substrate 10), four transfer gates TG (TG0, TG1, TG2, and TG3) are provided for one floating diffusion FD. The first through wire 71 is connected to the floating diffusion FD, and the second through wire 72 is connected to each transfer gate TG. Note that the transfer gate TG is provided for each sensor pixel 12.

As illustrated in FIG. 6, in the second layer (second substrate 20), the diffusion layer 74 is provided for the first through wire 71 connected to the floating diffusion FD. The diffusion layer 74 is formed in a semiconductor layer **20*a* so as to extend in the vertical direction in FIG. 6. The semiconductor layer 20*a* and a semiconductor layer 20*b* are divided by the insulating layer 53 and the insulating layer 54. Ends of the insulating layer 53 and the insulating layer 54 are integrated with their ends connected to each other. One gate layer 75 is provided for each second through wire 72 connected to each of the transfer transistors TR0 and TR3**.

In the second layer, a plurality of signal lines including control lines and the like are further provided so as to extend in a left-right direction in FIG. 6. Each of the signal lines includes, for example, a pixel drive line 23, a vertical signal line 24, a connection wiring 55, and the like. Any of the signal lines is connected to the first through wire 71 and the second through wire 72. Further, any of the signal lines is also connected to transistors such as the amplification transistor AMP, the reset transistor RST, and the selection transistor SEL via each connection line. These connection lines include, for example, a connection section 59 and the like.

As illustrated in FIG. 7, the diffusion layer 74 is positioned above the floating diffusion FD, and is provided in the second semiconductor substrate 21 so as to be in contact with the first through wire 71 that is connected to the floating diffusion FD and penetrates the second semiconductor substrate 21. The first through wire 71 penetrates the diffusion layer 74.

The gate layer 75 is positioned above the transfer gate TG3 (TG in FIG. 7), and is provided above the second semiconductor substrate 21 so as to be in contact with the second through wire 72 that is connected to the transfer gate TG3 and penetrates the second semiconductor substrate 21. The second through wire 72 penetrates the gate layer 75. The gate layer 75 extends to a position not in contact with the diffusion layer 74 and above the semiconductor layer 20*a*. Note that, similarly, the gate layer 75 is provided for the second through wire 72 connected to the transfer gate TG0 (see FIG. 6).

Here, the gate layer 75 is provided on the second semiconductor substrate 21 via an insulating film, and this insulating film is a part of the insulating layer 52. Similarly, the transfer gate TG3 is also provided on the first semiconductor substrate 11 via an insulating film, and this insulating film is a part of the insulating layer 46.

On the other hand, as illustrated in FIG. 8, the diffusion layer 74 is provided for the first through wire 71 connected to the floating diffusion FD, but the gate layer 75 is not provided for the second through wire 72 connected to the transfer gate TG1 (TG in FIG. 8). Note that, similarly, the gate layer 75 is not provided for the second through wire 72 connected to the transfer gate TG2 (see FIG. 6).

With such a layer structure, the diffusion layer 74 and the gate layer 75 function as share contacts and adjust the TG-FD capacitance (for example, the coupling amount of capacitive coupling). That is, the TG-FD capacitance that cannot be matched in the first layer or the like can be adjusted by the diffusion layer 74 as the second layer and the gate layer 75.

For example, in a case where the diffusion layer 74 and the gate layer 75 are not provided, the individual TG-FD capacitance of each of the transfer gates TG1 and TG2 is larger than that of the other transfer gates TG0 and TG3 (see FIG. 6). Accordingly, by providing the diffusion layer 74 and the gate layer 75 for the transfer gates TG0 and TG3, respectively, it is possible to increase the FD-TG capacitance of the transfer gates TG0 and TG3 to approximate the FD-TG capacitance of the transfer gates TG1 and TG2. Thus, the individual FD-TG capacitances of the transfer gates TG0 to TG3 can be made uniform.

Note that the floating diffusion FD (or the diffusion layer 74) and the gate layer 75 may be arranged so as to overlap each other, may be arranged so as to be flush with each other, or may be arranged so as to be separated from each other in a plane viewed from the light incident surface.

1-6. Modification of Layer Structure of Solid-State Imaging Element

Figure 9:
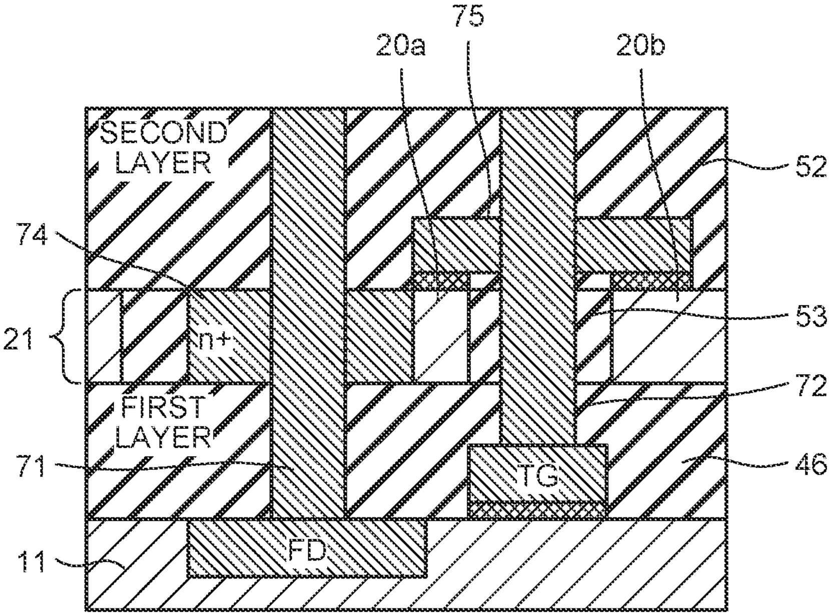
FIG. 9 is a cross-sectional view illustrating a modification of the solid-state imaging element according to the first embodiment taken along line A-A in FIG. 6.

A modification of the layer structure of the solid-state imaging element 1 according to the first embodiment will be described with reference to FIG. 9. FIG. 9 is a cross-sectional view illustrating a modification of the solid-state imaging element according to the first embodiment taken along line A-A in FIG. 6.

As illustrated in FIG. 9, similarly to FIG. 7, the gate layer 75 is provided for the second through wire 72 connected to the transfer gate TG3 (TG in FIG. 9). The gate layer 75 extends above the semiconductor layer 20*a* on the diffusion layer 74 side and above the semiconductor layer 20*b* facing the semiconductor layer 20*a* with the second through wire 72 interposed therebetween.

Even in such a layer structure, the diffusion layer 74 and the gate layer 75 function as share contacts and adjust the TG-FD capacitance. That is, the TG-FG capacitance that cannot be matched in the first layer or the like can be adjusted by the diffusion layer 74 as the second layer and the gate layer 75.

1-7. Example of Method of Manufacturing Solid-State Imaging Element

Figure 10:
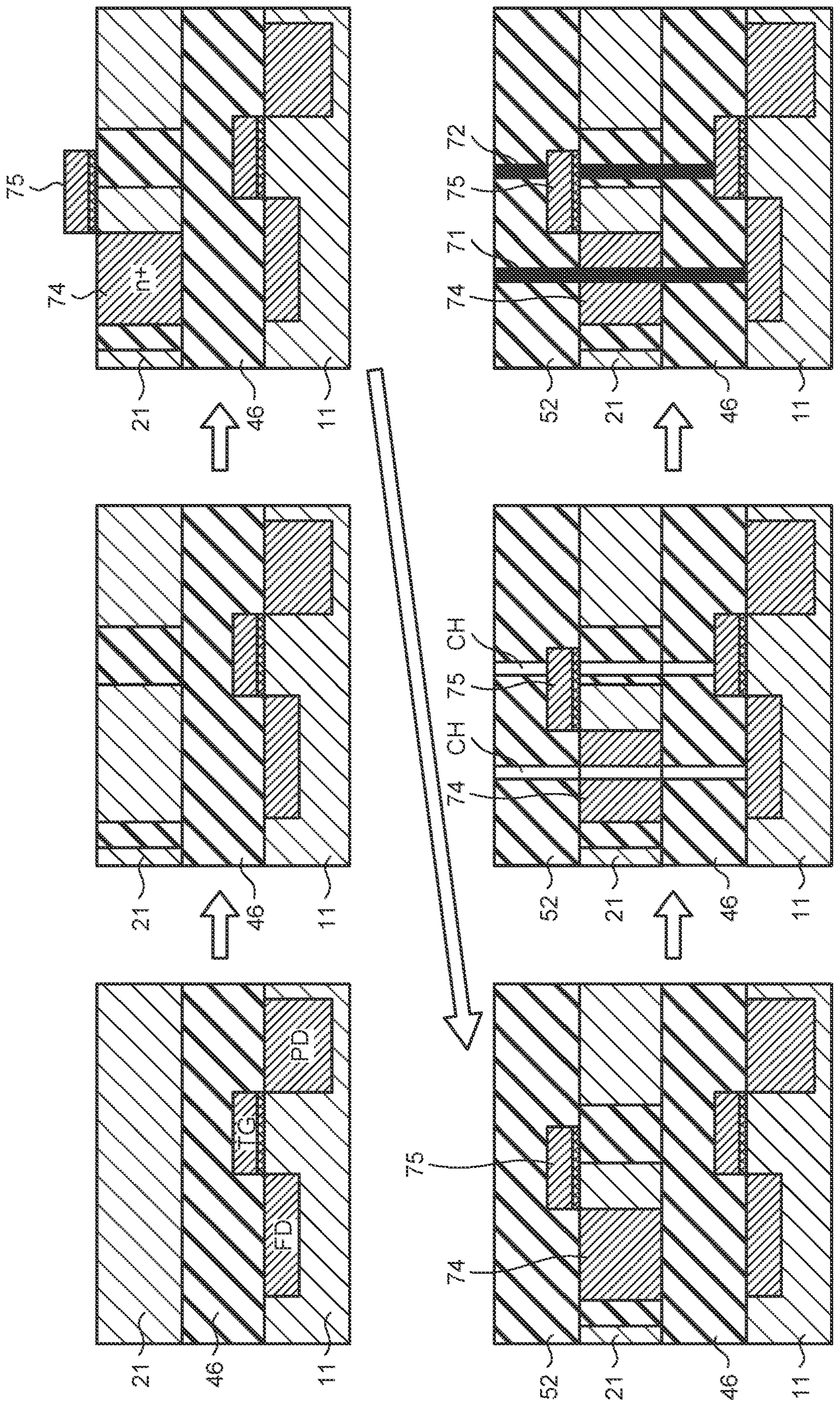
FIG. 10 is a cross-sectional view for explaining the manufacturing process of the solid-state imaging element according to the first embodiment.

A method of manufacturing the solid-state imaging element 1 according to the first embodiment will be described with reference to FIG. 10. FIG. 10 is a cross-sectional view for explaining the manufacturing process of the solid-state imaging element 1 according to the first embodiment. Note that, in FIG. 10, for the sake of clarity, only a main part of the solid-state imaging element 1 is illustrated, and illustration of other parts is omitted.

As illustrated in an upper left part of FIG. 10, the first semiconductor substrate 11 on which the element (for example, the photodiode PD, the floating diffusion FD, the transfer gate TG, and the like) is formed and the second semiconductor substrate 21 are bonded via the insulating layer 46, and the second semiconductor substrate 21 is thinned using a grinder, chemical mechanical polishing (CMP), or the like.

Next, as illustrated in an upper center of FIG. 10, a part of the semiconductor substrate (semiconductor layer) 21 is removed by lithography, dry etching, or the like. Furthermore, an insulating film (for example, SiO) is embedded in the portion from which the semiconductor layer has been removed.

Next, as illustrated in an upper right part of FIG. 10, the diffusion layer 74 and the gate layer 75 are formed on the second semiconductor substrate 21 by using lithography, ion implantation, or the like.

Furthermore, as illustrated in a lower left part of FIG. 10, an insulating film (for example, SiO) is deposited on the second semiconductor substrate 21 using chemical vapor deposition (CVD) or the like to thereby form the insulating layer 52.

Next, as illustrated in a lower center of FIG. 10, the insulating layer 52, the second semiconductor substrate 21, and the insulating layer 46 are etched using lithography, dry etching, or the like to thereby form a through hole CH penetrating the insulating layer 52, the second semiconductor substrate 21, and the insulating layer 46.

Next, a barrier metal, a metal film, or the like is formed in the through hole CH by a CVD method, a physical vapor deposition (PVD) method, an atomic layer deposition (ALD) method, a plating method, or the like so as to fill the through hole CH. Furthermore, an excessive metal film or the like protruding from the through hole CH is removed by using CMP, dry etching, or the like.

Thus, the first through wire 71 and the second through wire 72 are formed as illustrated in a lower right part of FIG. 10, and a configuration as illustrated in the lower right part of FIG. 10 is obtained.

1-8. Effects

As described above, according to the first embodiment, the diffusion layer 74 is provided in the second semiconductor substrate 21 so as to be in contact with the first through wire 71, and the gate layer 75 is provided on the second semiconductor substrate 21 so as to be in contact with the second through wire 72 without being in contact with the diffusion layer 74 (see FIGS. 7 and 9). The diffusion layer 74 and the gate layer 75 function as an adjustment layer that adjusts the TG-FD capacitance. Thus, the TG-FD capacitance can be adjusted only by providing the diffusion layer 74 and the gate layer 75 on the second semiconductor substrate 21 as the second layer, instead of adjusting the TG-FD capacitance by optimizing the wiring or increasing the wiring layer. Therefore, adjustment of the TG-FD capacitance can be facilitated while suppressing an increase in the number of wiring layers.

Note that the diffusion layer 74 may be formed by a material different from or the same as the material of the floating diffusion FD. In addition, the gate layer 75 may be formed by a material different from the transfer gate TG or the same material as the transfer gate TG (for example, polysilicon). When the same material is used, it is possible to facilitate preparation of the material and reduce cost.

2. Second Embodiment

2-1. Example of Layer Structure of Solid-State Imaging Element

Figure 11:
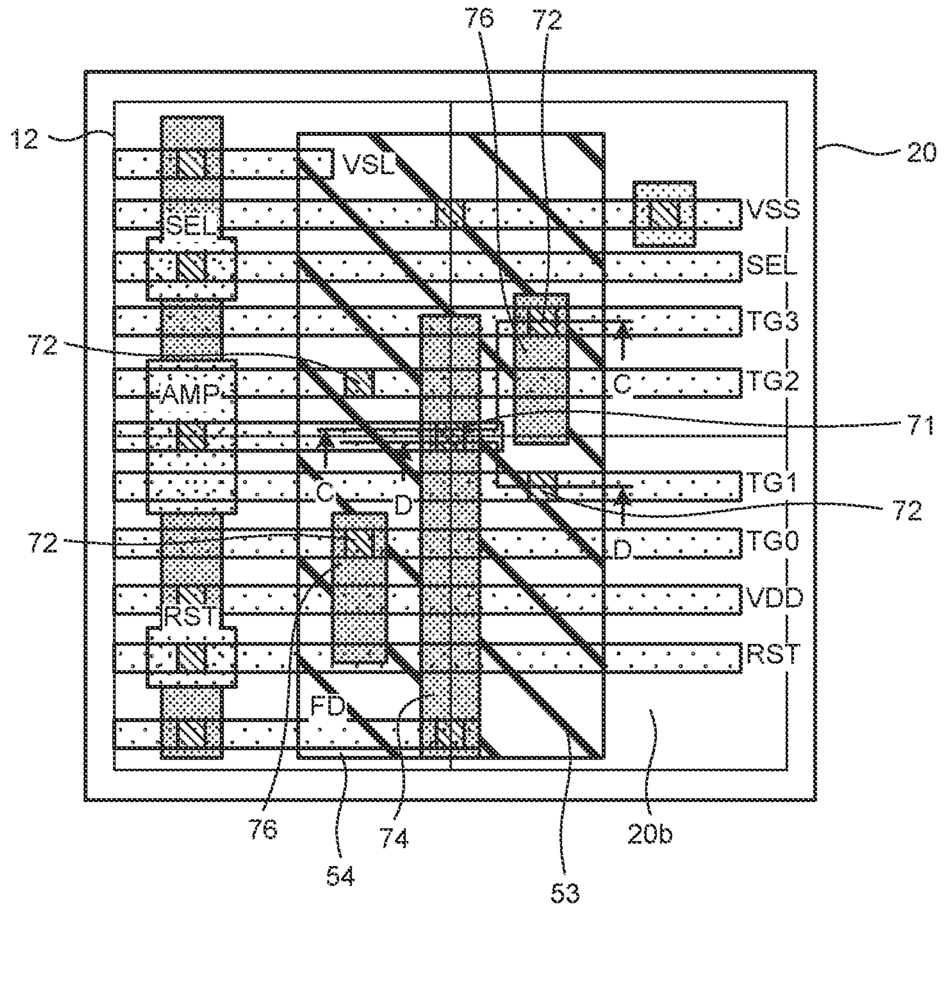
FIG. 11 is a plan view illustrating an example of a schematic configuration of a second layer and a wiring layer of a solid-state imaging element according to a second embodiment.
Figure 12:
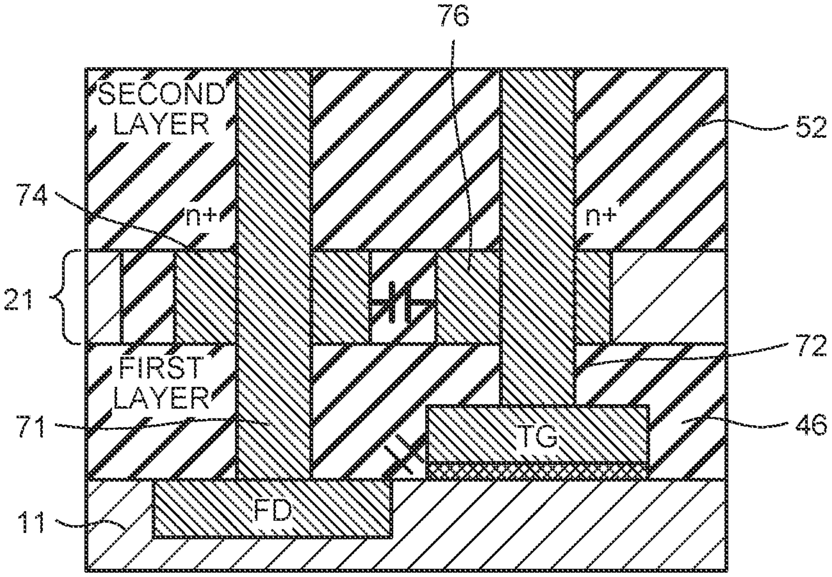
FIG. 12 is a cross-sectional view illustrating a first layer and the second layer of the solid-state imaging element according to the second embodiment taken along line C-C in FIG. 11.

An example of a layer structure of a solid-state imaging element 1 according to a second embodiment will be described with reference to FIGS. 11 and 12. FIG. 11 is a plan view illustrating an example of a schematic configuration of a second layer and a wiring layer of the solid-state imaging element 1 according to the second embodiment. FIG. 12 is a cross-sectional view illustrating a first layer and the second layer of the solid-state imaging element 1 according to the second embodiment taken along line C-C in FIG. 11. Hereinafter, differences from the first embodiment will be mainly described, and other descriptions will be omitted.

Note that a plan view illustrating an example of a schematic configuration of the first layer of the solid-state imaging element 1 according to the second embodiment is the same as the plan view illustrated in FIG. 5. Further, a cross-sectional view illustrating the first layer and the second layer of the solid-state imaging element 1 according to the second embodiment taken along line D-D in FIG. 11 is the same as the cross-sectional view illustrated in FIG. 8. However, in the second embodiment, the semiconductor layer 20*a* illustrated in FIG. 8 is an insulating layer.

As illustrated in FIG. 11, instead of the gate layer 75 illustrated in FIG. 6, one diffusion layer 76 is provided for each of the second through wire 72 connected to the transfer gate TG0 and the second through wire 72 connected to the transfer gate TG3. Further, the insulating layer 53 and the insulating layer 54 are integrated with their ends connected to each other, and are formed so as to be in contact with and sandwich the diffusion layer 74.

As illustrated in FIG. 12, the diffusion layer 76 is positioned above the transfer gate TG3 (TG in FIG. 12), and is provided in the second semiconductor substrate 21 so as to be in contact with the second through wire 72 that is connected to the transfer gate TG3 and penetrates the second semiconductor substrate 21. The second through wire 72 penetrates the diffusion layer 76. Note that, similarly, the diffusion layer 76 is provided for the second through wire 72 connected to the transfer gate TG0 (see FIG. 11).

According to such a layer structure, the diffusion layer (first diffusion layer) 74 and the diffusion layer (second diffusion layer) 76 function as share contacts and adjust the TG-FD capacitance. That is, the TG-FG capacitance that cannot be matched in the first layer or the like can be adjusted by the diffusion layer 74 as the second layer and the diffusion layer 76.

For example, in a case where the diffusion layer 74 or the diffusion layer 76 is not provided, the individual TG-FD capacitance of each of the transfer gates TG1 and TG2 is larger than that of the other transfer gates TG0 and TG3. Accordingly, by providing the diffusion layer 74 and the diffusion layer 76 for the transfer gates TG0 and TG3, respectively, the individual FD-TG capacitance of each of the transfer gates TG0 and TG3 can be increased to be close to the individual FD-TG capacitance of each of the transfer gates TG1 and TG2. Thus, the individual FD-TG capacitances of the transfer gates TG0 to TG3 can be made uniform.

2-2. Modification of Layer Structure of Solid-State Imaging Element

Figure 13:
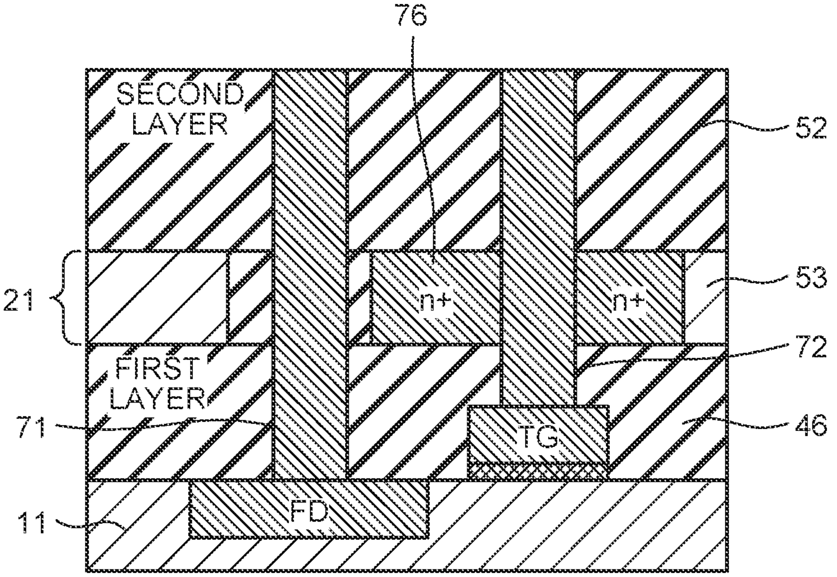
FIG. 13 is a cross-sectional view illustrating a modification of the solid-state imaging element according to the second embodiment taken along line C-C in FIG. 11.

A modification of the layer structure of the solid-state imaging element 1 according to the second embodiment will be described with reference to FIG. 13. FIG. 13 is a cross-sectional view illustrating a modification of the solid-state imaging element 1 according to the second embodiment taken along line C-C in FIG. 11.

As illustrated in FIG. 13, the diffusion layer 74 illustrated in FIG. 12 is deleted, and the diffusion layer 76 is larger than that in FIG. 12. That is, the volume of the diffusion layer 76 illustrated in FIG. 13 is larger than that of the diffusion layer 76 illustrated in FIG. 12. For example, the diffusion layer 76 is formed so as to overlap the floating diffusion FD in a plane viewed from the light incident surface.

Even in such a layer structure, the diffusion layer 76 functions as a share contact and adjusts the TG-FD capacitance. That is, the TG-FG capacitance that cannot be matched in the first layer or the like can be adjusted by the diffusion layer 74 as the second layer and the gate layer 75.

2-3. Effects

As described above, according to the second embodiment, the same effects as those of the first embodiment can be obtained. That is, the diffusion layer 74 is provided in the second semiconductor substrate 21 so as to be in contact with the first through wire 71, and the diffusion layer 76 is provided in the second semiconductor substrate 21 so as to be in contact with the second through wire 72 without being in contact with the diffusion layer 74 (see FIG. 12). The diffusion layer 74 and the diffusion layer 76 function as an adjustment layer that adjusts the TG-FD capacitance. Thus, the TG-FD capacitance can be adjusted only by providing the diffusion layer 74 and the diffusion layer 76 on the second semiconductor substrate 21 as the second layer, instead of adjusting the TG-FD capacitance by optimizing the wiring or increasing the wiring layer. Therefore, adjustment of the TG-FD capacitance can be facilitated while suppressing an increase in the number of wiring layers.

In addition, the diffusion layer 74 is not provided, and the diffusion layer 76 is provided on the second semiconductor substrate 21 so as to be in contact with the second through wire 72 (see FIG. 13). The diffusion layer 76 functions as an adjustment layer that adjusts the TG-FD capacitance. Thus, the TG-FD capacitance can be adjusted only by providing the diffusion layer 76 on the second semiconductor substrate 21 as the second layer, instead of adjusting the TG-FD capacitance by optimizing the wiring or increasing the wiring layer. Therefore, adjustment of the TG-FD capacitance can be facilitated while suppressing an increase in the number of wiring layers.

Note that diffusion layer 74 and diffusion layer 76 may be formed by different materials or the same material. When the same material is used, it is possible to facilitate preparation of the material and reduce the cost, and moreover, it is possible to form the diffusion layer 74 and the diffusion layer 76 in the same process, so that the number of manufacturing processes can be reduced. As the material, for example, the same material as the floating diffusion FD can be used. That is, both or one of the diffusion layer 74 and the diffusion layer 76 may be formed by the same material as the floating diffusion FD. When the same material as the floating diffusion FD is used, it is possible to facilitate preparation of the material and reduce the cost.

3. Third Embodiment

3-1. Example of Layer Structure of Solid-State Imaging Element

Figure 14:
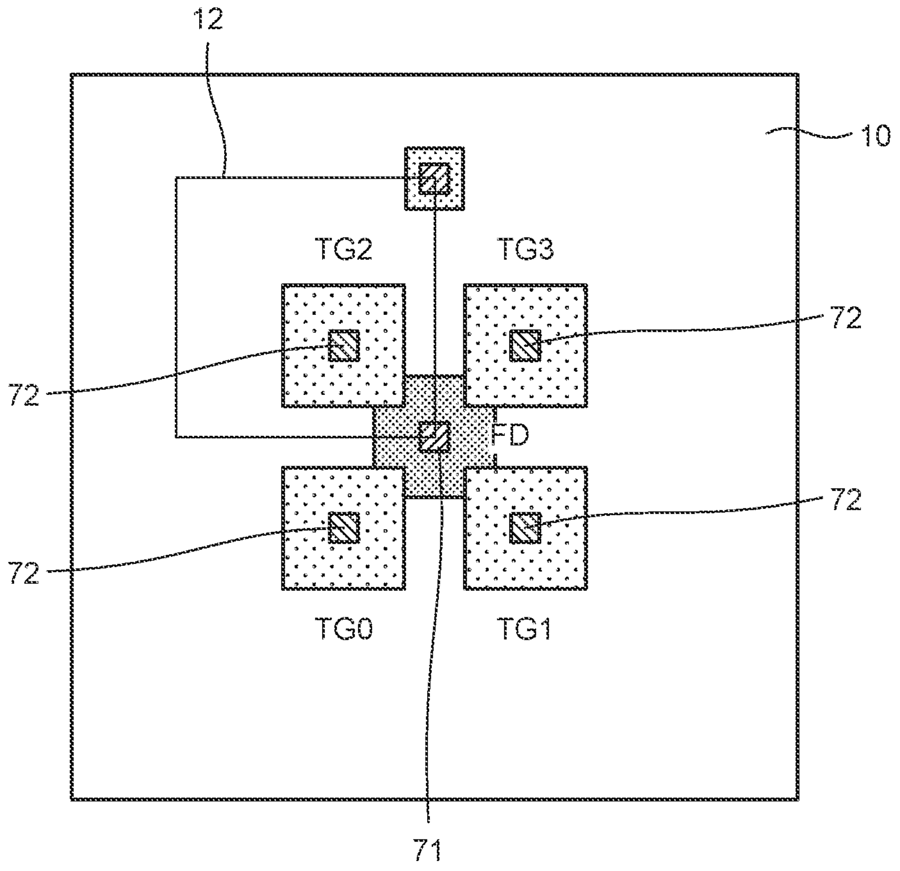
FIG. 14 is a plan view illustrating an example of a schematic configuration of a first layer of a solid-state imaging element according to a third embodiment.
Figure 15:
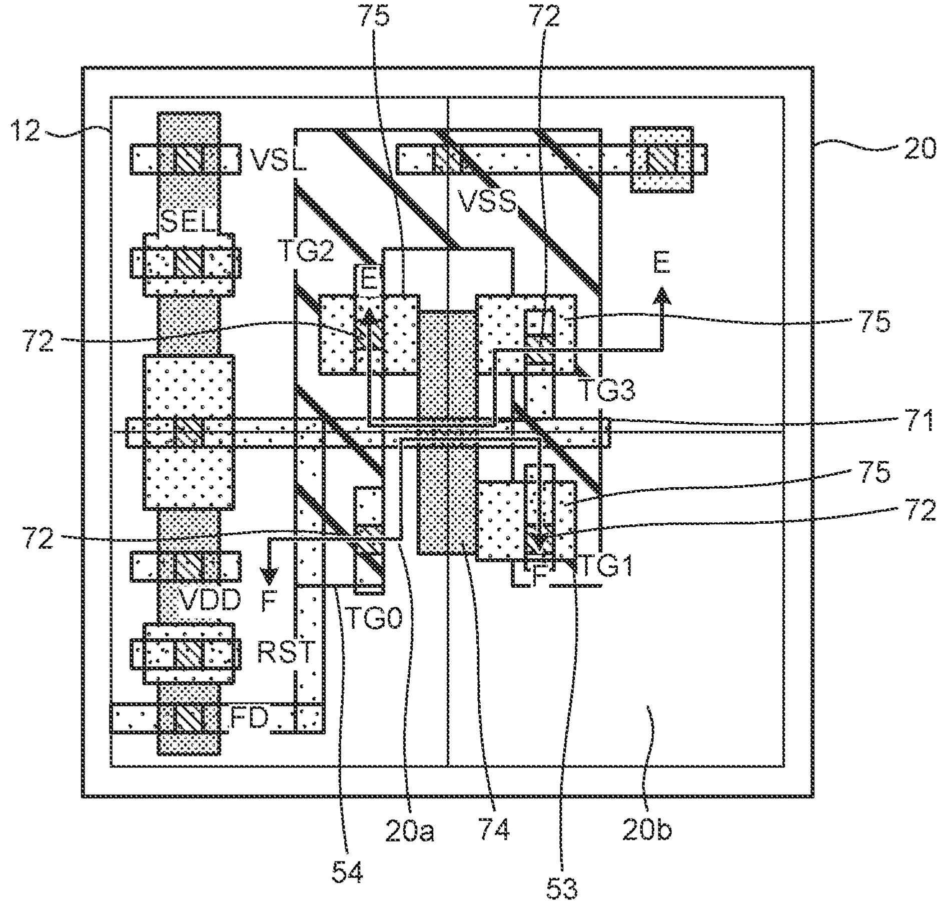
FIG. 15 is a plan view illustrating an example of a schematic configuration of a second layer and a wiring layer of the solid-state imaging element according to the third embodiment.

An example of a layer structure of a solid-state imaging element 1 according to a third embodiment will be described with reference to FIGS. 14 and 15. FIG. 14 is a plan view illustrating an example of a schematic configuration of a first layer of the solid-state imaging element 1 according to the third embodiment. FIG. 15 is a plan view illustrating an example of a schematic configuration of a second layer and a wiring layer of the solid-state imaging element 1 according to the third embodiment. Hereinafter, differences from the first embodiment will be mainly described, and other descriptions will be omitted.

As illustrated in FIG. 14, each of the second through wires 72 is provided so as to be located at the center (center in plan view) of the transfer gate TG. As illustrated in FIG. 15, one gate layer 75 is provided for each through wire 72 connected to each of the three transfer gates TG1, TG2, and TG3.

Note that a cross-sectional view of the first and second layers of the solid-state imaging element 1 according to the third embodiment taken along line E-E in FIG. 15 is the same as the cross-sectional view illustrated in FIG. 7. Further, a cross-sectional view of the first and second layers of the solid-state imaging element 1 according to the third embodiment taken along line F-F in FIG. 15 is the same as the cross-sectional view illustrated in FIG. 8.

With such a layer structure, similarly to the first embodiment, the diffusion layer 74 and the gate layer 75 function as share contacts and adjust the TG-FD capacitance. That is, the TG-FG capacitance that cannot be matched in the first layer or the like can be adjusted by the diffusion layer 74 as the second layer and the gate layer 75.

For example, in a case where the diffusion layer 74 and the gate layer 75 are not provided and the wiring for the floating diffusion FD is routed as in the example of FIG. 15, the FD-TG capacitance of the transfer gate TG0 is larger than those of the other transfer gates TG1, TG2, and TG3. Accordingly, by providing the diffusion layer 74 and the gate layer 75 for the transfer gates TG0 and TG3, respectively, the individual FD-TG capacitance of each of the transfer gates TG0 and TG3 can be increased to be close to the individual FD-TG capacitance of each of the transfer gates TG1 and TG2. Thus, the individual FD-TG capacitances of the transfer gates TG0 to TG3 can be made uniform. Further, the total FD capacitance can be optimized by changing the ratio between the FD base capacitance and the FD wiring capacitance.

3-2. Effects

As described above, according to the third embodiment, the same effects as those of the first embodiment can be obtained. That is, instead of adjusting the TG-FD capacitance by optimizing the wiring or increasing the wiring layer, the TG-FD capacitance can be adjusted only by providing the diffusion layer 74 and the gate layer 75 on the second semiconductor substrate 21 as the second layer. Therefore, adjustment of the TG-FD capacitance can be facilitated while suppressing an increase in the number of wiring layers.

4. Fourth Embodiment

4-1. Example of Layer Structure of Solid-State Imaging Element

Figure 16:
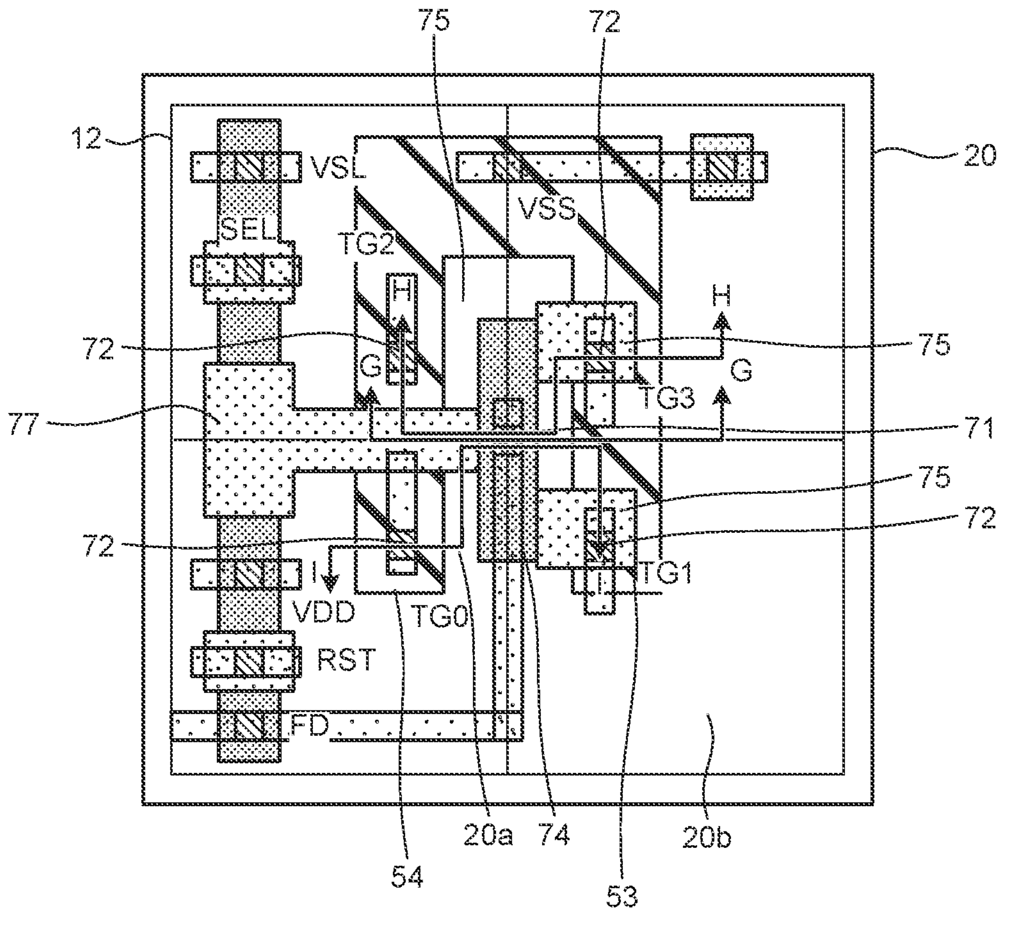
FIG. 16 is a plan view illustrating an example of a schematic configuration of a second layer and a wiring layer of a solid-state imaging element according to a fourth embodiment.
Figure 17:
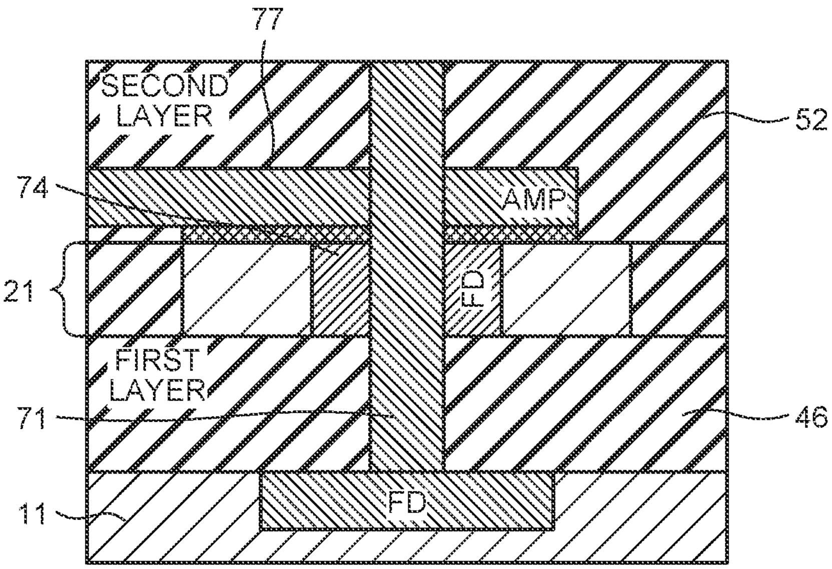
FIG. 17 is a cross-sectional view illustrating a first layer and the second layer of the solid-state imaging element according to the fourth embodiment taken along line G-G in FIG. 16.

An example of a layer structure of a solid-state imaging element 1 according to a fourth embodiment will be described with reference to FIGS. 16 and 17. FIG. 16 is a plan view illustrating an example of a schematic configuration of a second layer and a wiring layer of the solid-state imaging element 1 according to the fourth embodiment. FIG. 17 is a cross-sectional view illustrating a first layer and the second layer of the solid-state imaging element 1 according to the fourth embodiment taken along line G-G in FIG. 16. Hereinafter, differences from the third embodiment will be mainly described, and other descriptions will be omitted.

As illustrated in FIGS. 16 and 17, a gate electrode 77 of the amplification transistor AMP extends to above the diffusion layer 74. The diffusion layer 74 functions as a share contact. As illustrated in FIG. 16, one gate layer 75 is provided for each of the second through wires 72 respectively connected to the two transfer gates TG1 and TG3.

Note that a plan view illustrating an example of a schematic configuration of the first layer of the solid-state imaging element 1 according to the fourth embodiment is the same as the plan view illustrated in FIG. 14. Further, a cross-sectional view of the first and second layers of the solid-state imaging element 1 according to the fourth embodiment taken along line H-H in FIG. 16 is the same as the cross-sectional view illustrated in FIG. 7. A cross-sectional view of the first and second layers of the solid-state imaging element 1 according to the fourth embodiment taken along line I-I in FIG. 16 is the same as the cross-sectional view illustrated in FIG. 8.

With such a layer structure, similarly to the first embodiment, the diffusion layer 74 and the gate layer 75 function as share contacts and adjust the TG-FD capacitance. That is, the TG-FG capacitance that cannot be matched in the first layer or the like can be adjusted by the diffusion layer 74 as the second layer and the gate layer 75.

For example, in a case where the diffusion layer 74 and the gate layer 75 are not provided and the wiring for the floating diffusion FD is routed as in the example of FIG. 16, the individual FD-TG capacitances of the transfer gates TG0 and TG2 become larger than those of the other transfer gates TG1 and TG3. Accordingly, by providing the diffusion layer 74 and the gate layer 75 for the transfer gates TG1 and TG3, respectively, the individual FD-TG capacitance of each of the transfer gates TG1 and TG3 can be increased to be close to the individual FD-TG capacitance of each of the transfer gates TG0 and TG2. Thus, the individual FD-TG capacitances of the transfer gates TG1 to TG4 can be made uniform. Further, the total FD capacitance can be optimized by changing the ratio between the FD base capacitance and the FD wiring capacitance.

4-2. Effects

As described above, according to the fourth embodiment, the same effects as those of the third embodiment can be obtained. That is, instead of adjusting the TG-FD capacitance by optimizing the wiring or increasing the wiring layer, the TG-FD capacitance can be adjusted only by providing the diffusion layer 74 and the gate layer 75 on the second semiconductor substrate 21 as the second layer. Therefore, adjustment of the TG-FD capacitance can be facilitated while suppressing an increase in the number of wiring layers. Further, the total FD capacitance can be optimized by changing the ratio between the FD base capacitance and the FD wiring capacitance.

5. Other Embodiments

The processing according to the above embodiment may be performed in various different forms (modifications) other than the above embodiment. For example, the configuration is not limited to the above-described example, and may be various modes. Further, for example, the configuration, the processing procedure, the specific name, and the information including various data and parameters illustrated in the document or the drawings can be arbitrarily changed unless otherwise specified.

Further, each component of each device illustrated in the drawings is functionally conceptual, and is not necessarily physically configured as illustrated in the drawings. That is, a specific form of distribution and integration of each device is not limited to the illustrated form, and all or a part thereof can be functionally or physically distributed and integrated in any unit according to various loads, usage conditions, and the like.

In the above embodiments and modifications, the conductivity types may be reversed. For example, in the description of each embodiment and each modification, the p-type may be replaced with the n-type, and the n-type may be replaced with the p-type. Even in this case, similar effects to those of respective embodiments and respective modifications can be obtained.

In addition, in the above-described embodiments and respective modifications, as the element isolation section 43, an isolation section of the deep trench isolation (DTI) type in which a trench is formed from the back surface to the middle of the first semiconductor substrate 11 has been exemplified, but the element isolation section is not limited thereto, and for example, an isolation section penetrating the first semiconductor substrate 11 (full trench) and electrically completely isolating two or more adjacent sensor pixels 12 may be used.

Further, the solid-state imaging element 1 according to each of the above-described embodiments and modifications can be applied not only as a visible light receiving element but also to an element capable of detecting various types of radiation such as infrared rays, ultraviolet rays, X-rays, and electromagnetic waves. The present invention can also be applied to various applications such as distance measurement, change in light amount, and detection of physical properties in addition to image output.

6. Application Example

The solid-state imaging element 1 according to each of the above embodiments and modifications is applied to various electronic devices. Examples of the electronic device include electronic devices having an imaging function, such as a digital still camera, a video camera, a smartphone, a tablet terminal, a mobile phone, a personal digital assistant (PDA), a notebook personal computer (PC), and a desktop PC.

Figure 18:
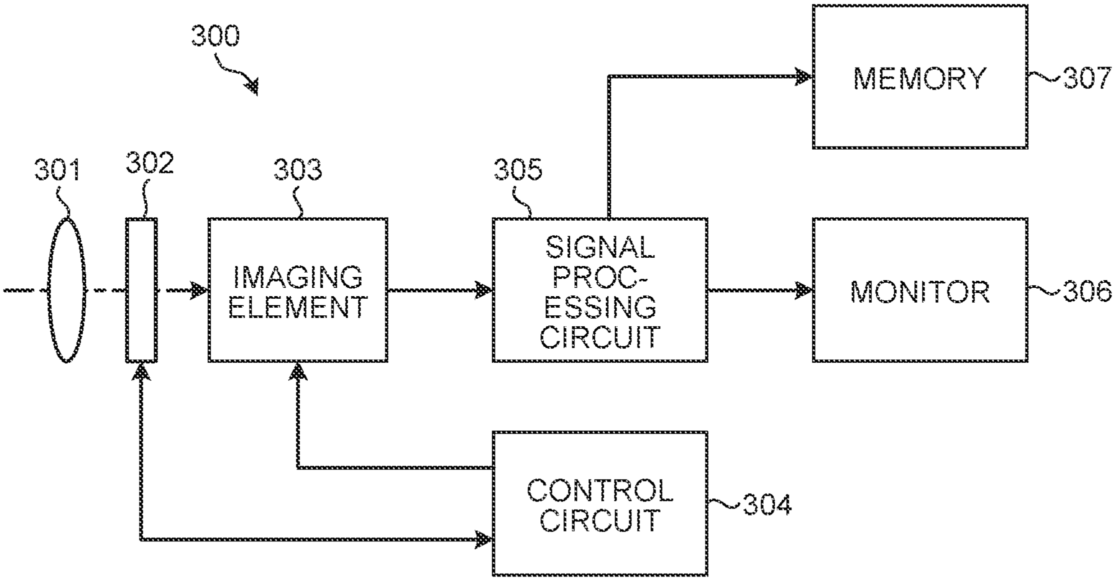
FIG. 18 is a block diagram illustrating an example of a schematic configuration of an imaging device.

An example of an imaging device 300 will be described with reference to FIG. 18. The imaging device 300 is an example of an electronic device. FIG. 18 is a block diagram illustrating an example of a schematic configuration of the imaging device 300 as an electronic device to which the present technology is applied.

As illustrated in FIG. 18, the imaging device 300 includes an optical system 301, a shutter device 302, an imaging element 303, a control circuit (drive circuit) 304, a signal processing circuit 305, a monitor 306, and a memory 307. The imaging device 300 can capture a still image and a moving image. The imaging element 303 is any of the solid-state imaging elements 1 according to the above-described embodiments and modifications.

The optical system 301 includes one or more lenses. The optical system 301 guides light (incident light) from a subject to the imaging element 303 and forms an image on a light receiving surface of the imaging element 303.

The shutter device 302 is disposed between the optical system 301 and the imaging element 303. The shutter device 302 controls a light irradiation period and a light shielding period with respect to the imaging element 303 according to controlling of the control circuit 304.

The imaging element 303 accumulates signal charge for a certain period according to light formed on the light receiving surface via the optical system 301 and the shutter device 302. The signal charge accumulated in the imaging element 303 is transferred in accordance with a drive signal (timing signal) supplied from the control circuit 304.

The control circuit 304 outputs a drive signal for controlling a transfer operation of the imaging element 303 and a shutter operation of the shutter device 302 to drive the imaging element 303 and the shutter device 302.

The signal processing circuit 305 performs various types of signal processing on the signal charge output from the imaging element 303. An image (image data) obtained by performing the signal processing by the signal processing circuit 305 is supplied to the monitor 306 and is also supplied to the memory 307.

The monitor 306 displays a moving image or a still image captured by the imaging element 303 on the basis of the image data supplied from the signal processing circuit 305. As the monitor 306, for example, a panel type display device such as a liquid crystal panel or an organic electro luminescence (EL) panel is used.

The memory 307 stores the image data supplied from the signal processing circuit 305, that is, image data of a moving image or a still image captured by the imaging element 303. As the memory 307, for example, a recording medium such as a semiconductor memory or a hard disk is used.

Also in the imaging device 300 configured as described above, by using any one of the solid-state imaging elements 1 according to the above-described embodiments and modifications as the imaging element 303, it is possible to facilitate adjustment of the TG-FD capacitance while suppressing an increase in the number of wiring layers.

7. Application Example

A technology according to the present disclosure is applicable to various products. For example, the technology according to the present disclosure may be implemented as a device mounted on any type of mobile body such as an automobile, an electric vehicle, a hybrid electric vehicle, a motorcycle, a bicycle, a personal mobility, an airplane, a drone, a boat, a robot, a construction machine, an agricultural machine (tractor), and the like. In addition, for example, the technology according to the present disclosure may be applied to an endoscopic surgery system, a microscopic surgery system, or the like.

7-1. Vehicle Control System

Figure 19:
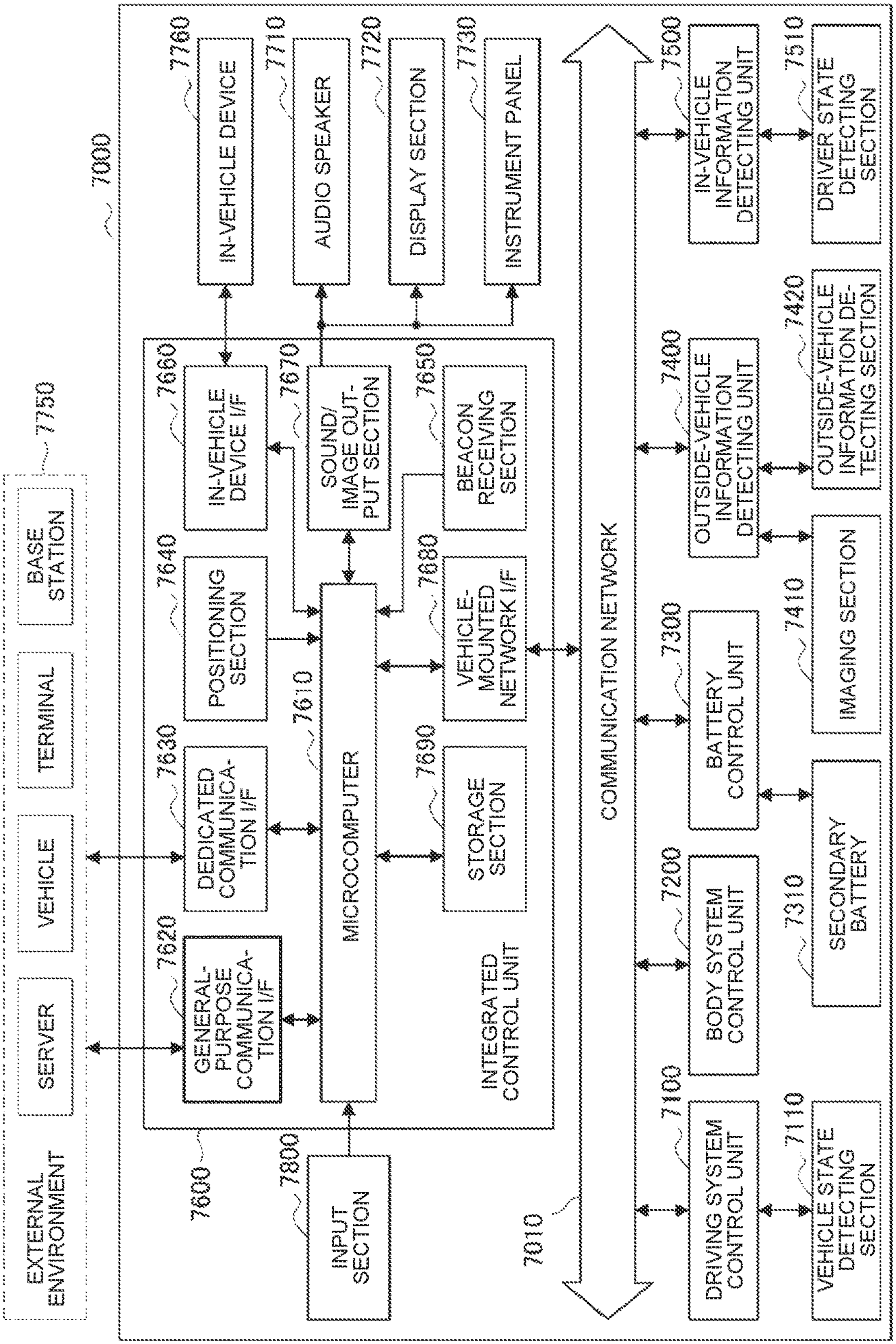
FIG. 19 is a block diagram depicting an example of a schematic configuration of a vehicle control system.

FIG. 19 is a block diagram depicting an example of schematic configuration of a vehicle control system 7000 as an example of a mobile body control system to which the technology according to an embodiment of the present disclosure can be applied. The vehicle control system 7000 includes a plurality of electronic control units connected to each other via a communication network 7010. In the example depicted in FIG. 19, the vehicle control system 7000 includes a driving system control unit 7100, a body system control unit 7200, a battery control unit 7300, an outside-vehicle information detecting unit 7400, an in-vehicle information detecting unit 7500, and an integrated control unit 7600. The communication network 7010 connecting the plurality of control units to each other may, for example, be a vehicle-mounted communication network compliant with an arbitrary standard such as controller area network (CAN), local interconnect network (LIN), local area network (LAN), FlexRay (registered trademark), or the like.

Each of the control units includes: a microcomputer that performs arithmetic processing according to various kinds of programs; a storage section that stores the programs executed by the microcomputer, parameters used for various kinds of operations, or the like; and a driving circuit that drives various kinds of control target devices. Each of the control units further includes: a network interface (I/F) for performing communication with other control units via the communication network 7010; and a communication I/F for performing communication with a device, a sensor, or the like within and without the vehicle by wire communication or radio communication. A functional configuration of the integrated control unit 7600 illustrated in FIG. 19 includes a microcomputer 7610, a general-purpose communication I/F 7620, a dedicated communication I/F 7630, a positioning section 7640, a beacon receiving section 7650, an in-vehicle device I/F 7660, a sound/image output section 7670, a vehicle-mounted network I/F 7680, and a storage section 7690. The other control units similarly include a microcomputer, a communication I/F, a storage section, and the like.

The driving system control unit 7100 controls the operation of devices related to the driving system of the vehicle in accordance with various kinds of programs. For example, the driving system control unit 7100 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like. The driving system control unit 7100 may have a function as a control device of an antilock brake system (ABS), electronic stability control (ESC), or the like.

The driving system control unit 7100 is connected with a vehicle state detecting section 7110. The vehicle state detecting section 7110, for example, includes at least one of a gyro sensor that detects the angular velocity of axial rotational movement of a vehicle body, an acceleration sensor that detects the acceleration of the vehicle, and sensors for detecting an amount of operation of an accelerator pedal, an amount of operation of a brake pedal, the steering angle of a steering wheel, an engine speed or the rotational speed of wheels, and the like. The driving system control unit 7100 performs arithmetic processing using a signal input from the vehicle state detecting section 7110, and controls the internal combustion engine, the driving motor, an electric power steering device, the brake device, and the like.

The body system control unit 7200 controls the operation of various kinds of devices provided to the vehicle body in accordance with various kinds of programs. For example, the body system control unit 7200 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 7200. The body system control unit 7200 receives these input radio waves or signals, and controls a door lock device, the power window device, the lamps, or the like of the vehicle.

The battery control unit 7300 controls a secondary battery 7310, which is a power supply source for the driving motor, in accordance with various kinds of programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device provided to the battery device or the like.

The outside-vehicle information detecting unit 7400 detects information about the outside of the vehicle including the vehicle control system 7000. For example, the outside-vehicle information detecting unit 7400 is connected with at least one of an imaging section 7410 and an outside-vehicle information detecting section 7420. The imaging section 7410 includes at least one of a time-of-flight (ToF) camera, a stereo camera, a monocular camera, an infrared camera, and other cameras. The outside-vehicle information detecting section 7420, for example, includes at least one of an environmental sensor for detecting current atmospheric conditions or weather conditions and a peripheral information detecting sensor for detecting another vehicle, an obstacle, a pedestrian, or the like on the periphery of the vehicle including the vehicle control system 7000.

The environmental sensor, for example, may be at least one of a rain drop sensor detecting rain, a fog sensor detecting a fog, a sunshine sensor detecting a degree of sunshine, and a snow sensor detecting a snowfall. The peripheral information detecting sensor may be at least one of an ultrasonic sensor, a radar device, and a LIDAR device (Light detection and Ranging device, or Laser imaging detection and ranging device). Each of the imaging section 7410 and the outside-vehicle information detecting section 7420 may be provided as an independent sensor or device, or may be provided as a device in which a plurality of sensors or devices are integrated.

Figure 20:
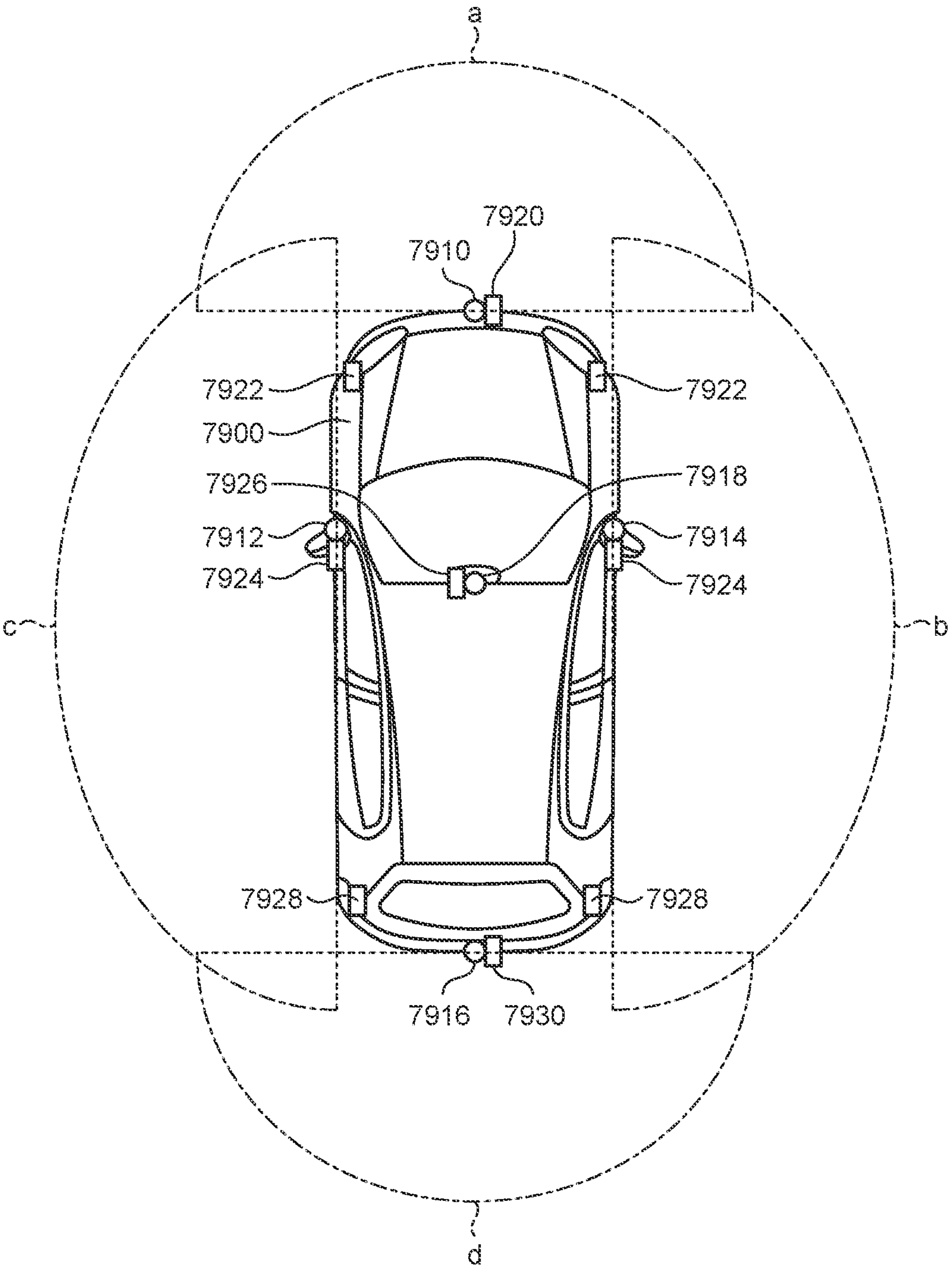
FIG. 20 is a diagram of assistance in explaining an example of installation positions of an outside-vehicle information detecting section and an imaging section.

FIG. 20 depicts an example of installation positions of the imaging section 7410 and the outside-vehicle information detecting section 7420. Imaging sections 7910, 7912, 7914, 7916, and 7918 are, for example, disposed at at least one of positions on a front nose, sideview mirrors, a rear bumper, and a back door of the vehicle 7900 and a position on an upper portion of a windshield within the interior of the vehicle. The imaging section 7910 provided to the front nose and the imaging section 7918 provided to the upper portion of the windshield within the interior of the vehicle obtain mainly an image of the front of the vehicle 7900. The imaging sections 7912 and 7914 provided to the sideview mirrors obtain mainly an image of the sides of the vehicle 7900. The imaging section 7916 provided to the rear bumper or the back door obtains mainly an image of the rear of the vehicle 7900. The imaging section 7918 provided to the upper portion of the windshield within the interior of the vehicle is used mainly to detect a preceding vehicle, a pedestrian, an obstacle, a signal, a traffic sign, a lane, or the like.

Incidentally, FIG. 20 depicts an example of photographing ranges of the respective imaging sections 7910, 7912, 7914, and 7916. An imaging range a represents the imaging range of the imaging section 7910 provided to the front nose. Imaging ranges b and c respectively represent the imaging ranges of the imaging sections 7912 and 7914 provided to the sideview mirrors. An imaging range d represents the imaging range of the imaging section 7916 provided to the rear bumper or the back door. A bird's-eye image of the vehicle 7900 as viewed from above can be obtained by superimposing image data imaged by the imaging sections 7910, 7912, 7914, and 7916, for example.

Outside-vehicle information detecting sections 7920, 7922, 7924, 7926, 7928, and 7930 provided to the front, rear, sides, and corners of the vehicle 7900 and the upper portion of the windshield within the interior of the vehicle may be, for example, an ultrasonic sensor or a radar device. The outside-vehicle information detecting sections 7920, 7926, and 7930 provided to the front nose of the vehicle 7900, the rear bumper, the back door of the vehicle 7900, and the upper portion of the windshield within the interior of the vehicle may be a LIDAR device, for example. These outside-vehicle information detecting sections 7920 to 7930 are used mainly to detect a preceding vehicle, a pedestrian, an obstacle, or the like.

Returning to FIG. 19, the description will be continued. The outside-vehicle information detecting unit 7400 makes the imaging section 7410 image an image of the outside of the vehicle, and receives imaged image data. In addition, the outside-vehicle information detecting unit 7400 receives detection information from the outside-vehicle information detecting section 7420 connected to the outside-vehicle information detecting unit 7400. In a case where the outside-vehicle information detecting section 7420 is an ultrasonic sensor, a radar device, or a LIDAR device, the outside-vehicle information detecting unit 7400 transmits an ultrasonic wave, an electromagnetic wave, or the like, and receives information of a received reflected wave. On the basis of the received information, the outside-vehicle information detecting unit 7400 may perform processing of detecting an object such as a human, a vehicle, an obstacle, a sign, a character on a road surface, or the like, or processing of detecting a distance thereto. The outside-vehicle information detecting unit 7400 may perform environment recognition processing of recognizing a rainfall, a fog, road surface conditions, or the like on the basis of the received information. The outside-vehicle information detecting unit 7400 may calculate a distance to an object outside the vehicle on the basis of the received information.

In addition, on the basis of the received image data, the outside-vehicle information detecting unit 7400 may perform image recognition processing of recognizing a human, a vehicle, an obstacle, a sign, a character on a road surface, or the like, or processing of detecting a distance thereto. The outside-vehicle information detecting unit 7400 may subject the received image data to processing such as distortion correction, alignment, or the like, and combine the image data imaged by a plurality of different imaging sections 7410 to generate a bird's-eye image or a panoramic image. The outside-vehicle information detecting unit 7400 may perform viewpoint conversion processing using the image data imaged by the imaging section 7410 including the different imaging parts.

The in-vehicle information detecting unit 7500 detects information about the inside of the vehicle. The in-vehicle information detecting unit 7500 is, for example, connected with a driver state detecting section 7510 that detects the state of a driver. The driver state detecting section 7510 may include a camera that images the driver, a biosensor that detects biological information of the driver, a microphone that collects sound within the interior of the vehicle, or the like. The biosensor is, for example, disposed in a seat surface, the steering wheel, or the like, and detects biological information of an occupant sitting in a seat or the driver holding the steering wheel. On the basis of detection information input from the driver state detecting section 7510, the in-vehicle information detecting unit 7500 may calculate a degree of fatigue of the driver or a degree of concentration of the driver, or may determine whether the driver is dozing. The in-vehicle information detecting unit 7500 may subject an audio signal obtained by the collection of the sound to processing such as noise canceling processing or the like.

The integrated control unit 7600 controls general operation within the vehicle control system 7000 in accordance with various kinds of programs. The integrated control unit 7600 is connected with an input section 7800. The input section 7800 is implemented by a device capable of input operation by an occupant, such, for example, as a touch panel, a button, a microphone, a switch, a lever, or the like. The integrated control unit 7600 may be supplied with data obtained by voice recognition of voice input through the microphone. The input section 7800 may, for example, be a remote control device using infrared rays or other radio waves, or an external connecting device such as a mobile telephone, a personal digital assistant (PDA), or the like that supports operation of the vehicle control system 7000. The input section 7800 may be, for example, a camera. In that case, an occupant can input information by gesture. Alternatively, data may be input which is obtained by detecting the movement of a wearable device that an occupant wears. Further, the input section 7800 may, for example, include an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD) or the like, a semiconductor storage device, an optical storage device, a magneto-optical storage device, or the like.

The general-purpose communication I/F 7620 is a communication I/F used widely, which communication I/F mediates communication with various apparatuses present in an external environment 7750. The general-purpose communication I/F 7620 may implement a cellular communication protocol such as global system for mobile communications (GSM (registered trademark)), worldwide interoperability for microwave access (WiMAX (registered trademark)), long term evolution (LTE (registered trademark)), LTE-advanced (LTE-A), or the like, or another wireless communication protocol such as wireless LAN (referred to also as wireless fidelity (Wi-Fi (registered trademark)), Bluetooth (registered trademark), or the like. The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal present in the vicinity of the vehicle (which terminal is, for example, a terminal of the driver, a pedestrian, or a store, or a machine type communication (MTC) terminal) using a peer to peer (P2P) technology, for example.

The dedicated communication I/F 7630 is a communication I/F that supports a communication protocol developed for use in vehicles. The dedicated communication I/F 7630 may implement a standard protocol such, for example, as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of communication between a vehicle and a vehicle (Vehicle to Vehicle), communication between a road and a vehicle (Vehicle to Infrastructure), communication between a vehicle and a home (Vehicle to Home), and communication between a pedestrian and a vehicle (Vehicle to Pedestrian).

The positioning section 7640, for example, performs positioning by receiving a global navigation satellite system (GNSS) signal from a GNSS satellite (for example, a GPS signal from a global positioning system (GPS) satellite), and generates positional information including the latitude, longitude, and altitude of the vehicle. Incidentally, the positioning section 7640 may identify a current position by exchanging signals with a wireless access point, or may obtain the positional information from a terminal such as a mobile telephone, a personal handyphone system (PHS), or a smart phone that has a positioning function.

The beacon receiving section 7650, for example, receives a radio wave or an electromagnetic wave transmitted from a radio station installed on a road or the like, and thereby obtains information about the current position, congestion, a closed road, a necessary time, or the like. Incidentally, the function of the beacon receiving section 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless universal serial bus (WUSB). In addition, the in-vehicle device I/F 7660 may establish wired connection by universal serial bus (USB), high-definition multimedia interface (HDMI (registered trademark)), mobile high-definition link (MHL), or the like via a connection terminal (and a cable if necessary) not depicted in the figures. The in-vehicle devices 7760 may, for example, include at least one of a mobile device and a wearable device possessed by an occupant and an information device carried into or attached to the vehicle. The in-vehicle devices 7760 may also include a navigation device that searches for a path to an arbitrary destination. The in-vehicle device I/F 7660 exchanges control signals or data signals with these in-vehicle devices 7760.

The vehicle-mounted network I/F 7680 is an interface that mediates communication between the microcomputer 7610 and the communication network 7010. The vehicle-mounted network I/F 7680 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. For example, the microcomputer 7610 may calculate a control target value for the driving force generating device, the steering mechanism, or the braking device on the basis of the obtained information about the inside and outside of the vehicle, and output a control command to the driving system control unit 7100. For example, the microcomputer 7610 may perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like. In addition, the microcomputer 7610 may perform cooperative control intended for automated driving, which makes the vehicle to travel automatedly without depending on the operation of the driver, or the like, by controlling the driving force generating device, the steering mechanism, the braking device, or the like on the basis of the obtained information about the surroundings of the vehicle.

The microcomputer 7610 may generate three-dimensional distance information between the vehicle and an object such as a surrounding structure, a person, or the like, and generate local map information including information about the surroundings of the current position of the vehicle, on the basis of information obtained via at least one of the general-purpose communication I/F 7620, the dedicated communication I/F 7630, the positioning section 7640, the beacon receiving section 7650, the in-vehicle device I/F 7660, and the vehicle-mounted network I/F 7680. In addition, the microcomputer 7610 may predict danger such as collision of the vehicle, approaching of a pedestrian or the like, an entry to a closed road, or the like on the basis of the obtained information, and generate a warning signal. The warning signal may, for example, be a signal for producing a warning sound or lighting a warning lamp.

The sound/image output section 7670 transmits an output signal of at least one of a sound and an image to an output device capable of visually or auditorily notifying information to an occupant of the vehicle or the outside of the vehicle. In the example of FIG. 19, an audio speaker 7710, a display section 7720, and an instrument panel 7730 are illustrated as the output device. The display section 7720 may, for example, include at least one of an on-board display and a head-up display. The display section 7720 may have an augmented reality (AR) display function. The output device may be other than these devices, and may be another device such as headphones, a wearable device such as an eyeglass type display worn by an occupant or the like, a projector, a lamp, or the like. In a case where the output device is a display device, the display device visually displays results obtained by various kinds of processing performed by the microcomputer 7610 or information received from another control unit in various forms such as text, an image, a table, a graph, or the like. In addition, in a case where the output device is an audio output device, the audio output device converts an audio signal constituted of reproduced audio data or sound data or the like into an analog signal, and auditorily outputs the analog signal.

Incidentally, at least two control units connected to each other via the communication network 7010 in the example depicted in FIG. 19 may be integrated into one control unit. Alternatively, each individual control unit may include a plurality of control units. Further, the vehicle control system 7000 may include another control unit not depicted in the figures. In addition, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

Note that a computer program for implementing each function of the imaging device 300 according to the application example can be mounted on any control unit or the like. Furthermore, it is also possible to provide a computer-readable recording medium storing such a computer program. The recording medium is, for example, a magnetic disk, an optical disk, a magneto-optical disk, a flash memory, or the like. In addition, the computer program described above may be distributed via, for example, a network without using the recording medium.

In the vehicle control system 7000 described above, the imaging device 300 according to the application example can be applied to the integrated control unit 7600 of the application example. For example, the control circuit 304, the signal processing circuit 305, and the memory 307 of the imaging device 300 may be implemented by the microcomputer 7610 or the storage section 7690 of the integrated control unit 7600. Furthermore, the solid-state imaging element 1 according to each of the above-described embodiments and modifications and the imaging device 300 according to the application example can be applied to the imaging section 7410 and the outside-vehicle information detecting section 7420 according to the application example, for example, the imaging sections 7910, 7912, 7914, 7916, and 7918 and the outside-vehicle information detecting sections 7920 to 7930, and the like according to the application example. By using any one of the solid-state imaging element 1 according to each of the above-described embodiments and modifications and the imaging device 300 according to the application example, even in the vehicle control system 7000, adjustment of the TG-FD capacitance can be facilitated while suppressing an increase in the number of wiring layers.

In addition, at least some components of the imaging device 300 according to the application example may be implemented in a module (for example, an integrated circuit module including one die) for the integrated control unit 7600 of the application example. Alternatively, a part of the imaging device 300 according to the application example may be implemented by a plurality of control units of the vehicle control system 7000.

7-2. Operating Room System

A technology according to the present disclosure is applicable to various products. For example, the technology according to the present disclosure may be applied to an operating room system.

Figure 21:
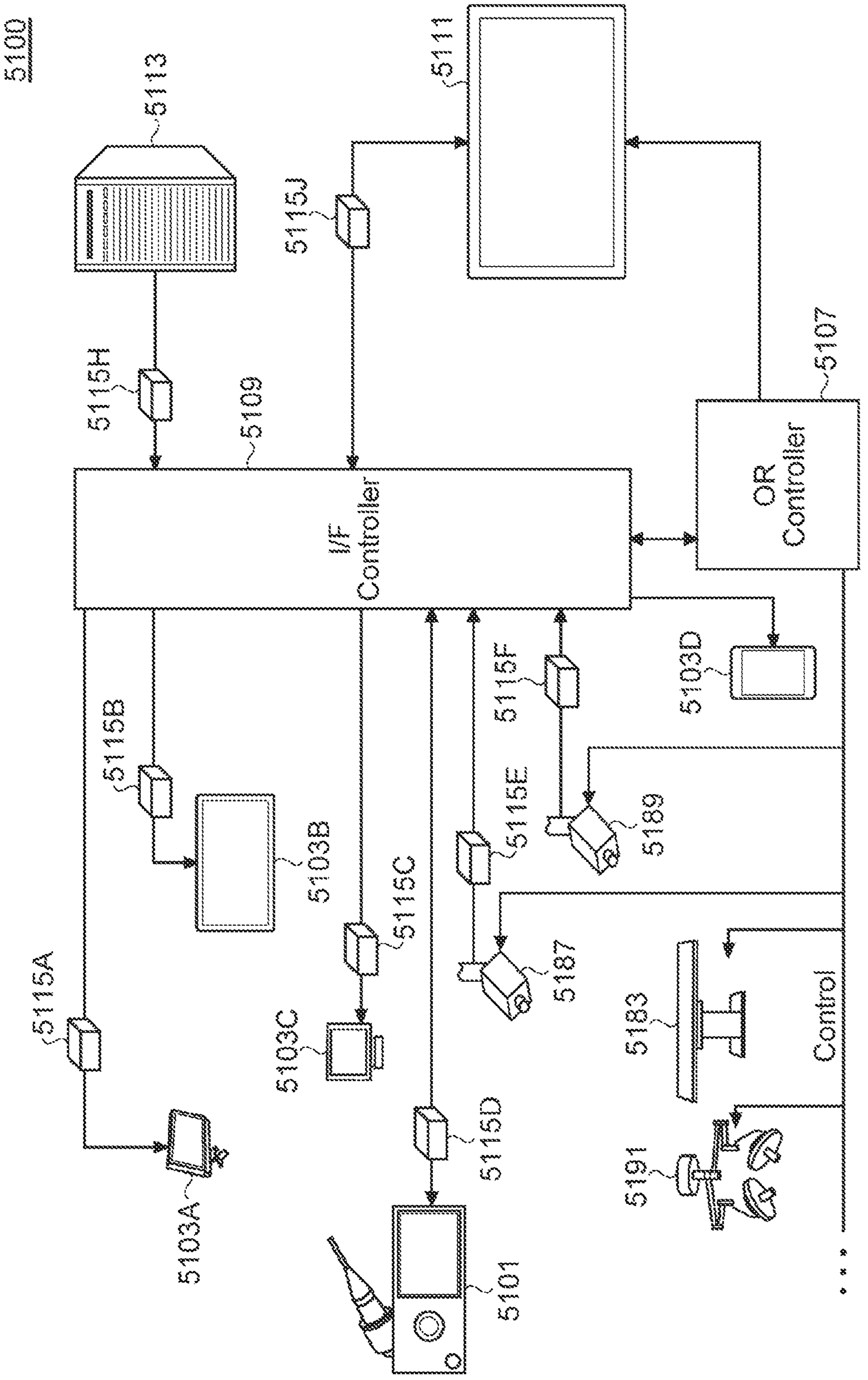
FIG. 21 is a diagram illustrating an overall schematic configuration of an operating room system.

FIG. 21 is a diagram schematically illustrating an overall configuration of an operating room system 5100 to which the technology according to the present disclosure is applicable. Referring to FIG. 21, the operating room system 5100 is configured by connecting a group of devices installed in an operating room so as to be capable of cooperating with one another via an operating room (OR) controller 5107 and an interface controller (IF Controller) 5109. The operating room system 5100 is configured using an Internet Protocol (IP) network capable of transmitting and receiving 4K/8K images, and transmits and receives input and output images and control information for the devices via the IP network.

Various devices can be installed in the operating room. FIG. 21 illustrates, as examples, a group of various devices 5101 for endoscopic surgery, a ceiling camera 5187 that is provided on the ceiling of the operating room and captures an area near the hands of an operator, an operating field camera 5189 that is provided on the ceiling of the operating room and captures an overall situation in the operating room, a plurality of display devices 5103A to 5103D, a patient bed 5183, and a light 5191. In addition to an endoscope illustrated, various medical devices for acquiring images and videos, such as a master-slave endoscopic surgery robot and an X-ray imaging device, may be applied to the group of devices 5101.

The group of devices 5101, the ceiling camera 5187, the operating field camera 5189, and the display devices 5103A to 5103C are connected to the IF controller 5109 via IP converters 5115A to 5115F (hereinafter, denoted by reference numeral 5115 when not individually distinguished). The IP converters 5115D, 5115E, and 5115F on video source sides (camera sides) perform IP conversion on videos from individual medical image capturing devices (such as an endoscope, an operation microscope, an X-ray imaging device, an operating field camera, and a pathological image capturing device), and transmit the results on the network. The IP converters 5115A to 5115D on video output sides (monitor sides) convert the videos transmitted through the network into monitor-unique formats, and output the results. The IP converters on the video source sides function as encoders, and the IP converters on the video output sides function as decoders. The IP converters 5115 may have various image processing functions, and may have functions of, for example, resolution conversion processing corresponding to output destinations, rotation correction and image stabilization of an endoscopic video, and object recognition processing. The image processing functions may also include partial processing such as feature information extraction for analysis on a server described later. These image processing functions may be specific to the connected medical image devices, or may be upgradable from outside. The IP converters on the display sides can perform processing such as synthesis of a plurality of videos (for example, picture-in-picture (PinP) processing) and superimposition of annotation information. The protocol conversion function of each of the IP converters is a function to convert a received signal into a converted signal conforming to a communication protocol allowing the signal to be transmitted on the network (such as the Internet). Any communication protocol may be set as the communication protocol. The signal received by the IP converter and convertible in terms of protocol is a digital signal, and is, for example, a video signal or a pixel signal. The IP converter may be incorporated in a video source side device or in a video output side device.

The group of devices 5101 belong to, for example, an endoscopic surgery system, and include, for example, the endoscope and a display device for displaying an image captured by the endoscope. The display devices 5103A to 5103D, the patient bed 5183, and the light 5191 are, for example, devices equipped in the operating room separately from the endoscopic surgery system. Each of these devices for surgical or diagnostic is also called a medical device. The OR controller 5107 and/or the IF controller 5109 controls operations of the medical devices in cooperation. When the endoscopic surgery robot (surgery master-slave) system and the medical image acquisition devices such as an X-ray imaging device are included in the operating room, those devices can also be connected as the group of devices 5101 in the same manner.

The OR controller 5107 controls processing related to image display in the medical devices in an integrated manner. Specifically, the group of devices 5101, the ceiling camera 5187, and the operating field camera 5189 among the devices included in the operating room system 5100 can each be a device having a function to transmit (hereinafter, also called a transmission source device) information to be displayed (hereinafter, also called display information) during the operation. The display devices 5103A to 5103D can each be a device to output the display information (hereinafter, also called an output destination device). The OR controller 5107 has a function to control operations of the transmission source devices and the output destination devices so as to acquire the display information from the transmission source devices and transmit the display information to the output destination devices to cause the output destination devices to display or record the display information. The display information refers to, for example, various images captured during the operation and various types of information on the operation (for example, body information and past examination results of a patient and information about a surgical procedure).

Specifically, information about an image of a surgical site in a body cavity of the patient captured by the endoscope can be transmitted as the display information from the group of devices 5101 to the OR controller 5107. Information about an image of the area near the hands of the operator captured by the ceiling camera 5187 can be transmitted as the display information from the ceiling camera 5187. Information about an image representing the overall situation in the operating room captured by the operating field camera 5189 can be transmitted as the display information from the operating field camera 5189. When another device having an imaging function is present in the operating room system 5100, the OR controller 5107 may also acquire information about an image captured by the other device as the display information from the other device.

The OR controller 5107 displays the acquired display information (that is, the images captured during the operation and the various types of information on the operation) on at least one of the display devices 5103A to 5103D serving as the output destination devices. In the illustrated example, the display device 5103A is a display device installed on the ceiling of the operating room, being hung therefrom; the display device 5103B is a display device installed on a wall surface of the operating room; the display device 5103C is a display device installed on a desk in the operating room; and the display device 5103D is a mobile device (such as a tablet personal computer (PC)) having a display function.

The IF controller 5109 controls input and output of the video signal from and to connected devices. For example, the IF controller 5109 controls input and output of the video signal based on controlling of the OR controller 5107. The IF controller 5109 includes, for example, an IP switcher, and controls high-speed transfer of the image (video) signal between devices disposed on the IP network.

The operating room system 5100 may include a device outside the operating room. The device outside the operating room can be a server connected to a network built in and outside a hospital, a PC used by a medical staff, or a projector installed in a meeting room of the hospital. When such an external device is present outside the hospital, the OR controller 5107 can also display the display information on a display device of another hospital via, for example, a teleconference system for telemedicine.

An external server 5113 is, for example, an in-hospital server or a cloud server outside the operating room, and may be used for, for example, image analysis and/or data analysis. In this case, the video information in the operating room may be transmitted to the external server 5113, and the server may generate additional information through big data analysis or recognition/analysis processing using artificial intelligence (AI) (machine learning), and feed the additional information back to the display devices in the operating room. At this time, an IP converter 5115H connected to the video devices in the operating room transmits data to the external server 5113, so that the video is analyzed. The transmitted data may be, for example, a video itself of the operation using the endoscope or other tools, metadata extracted from the video, and/or data indicating an operating status of the connected devices.

The operating room system 5100 is further provided with a central operation panel 5111. Through the central operation panel 5111, a user can give the OR controller 5107 an instruction about input/output control of the IF controller 5109 and an instruction about an operation of the connected devices. The user can switch image display through the central operation panel 5111. The central operation panel 5111 is configured by providing a touchscreen on a display surface of a display device. The central operation panel 5111 may be connected to the IF controller 5109 via an IP converter 5115J.

The IP network may be established using a wired network, or a part or the whole of the network may be established using a wireless network. For example, each of the IP converters on the video source sides may have a wireless communication function, and may transmit the received image to an output side IP converter via a wireless communication network, such as the fifth-generation mobile communication system (5G) or the sixth-generation mobile communication system (6G).

The technology according to the present disclosure can be suitably applied to the ceiling camera 5187 and the operating field camera 5189 among the configurations described above. Specifically, the solid-state imaging element 1 according to each of the above embodiments and modifications and the imaging device 300 according to the application example can be applied to the ceiling camera 5187, the operating field camera 5189, and the like. By using any one of the solid-state imaging element 1 according to each of the above-described embodiments and modifications and the imaging device 300 according to the application example, even in the operating room system 5100, it is possible to facilitate adjustment of the TG-FD capacitance while suppressing an increase in the number of wiring layers.

8. Appendix

Note that the present technology can also have the following configurations.

(1)

A solid-state imaging element, comprising:

a first semiconductor substrate;

a second semiconductor substrate stacked on the first semiconductor substrate with an insulating layer interposed therebetween;

a photoelectric conversion element that is provided on the first semiconductor substrate and generates charge by photoelectric conversion;

a floating diffusion layer that is provided on the first semiconductor substrate and retains the charge generated by the photoelectric conversion element;

a transfer gate that is a gate electrode of a transfer transistor that is provided on the first semiconductor substrate and transfers the charge generated by the photoelectric conversion element to the floating diffusion layer;

a first through wire electrically connected to the floating diffusion layer and penetrating the insulating layer and the second semiconductor substrate;

a second through wire electrically connected to the transfer gate and penetrating the insulating layer and the second semiconductor substrate;

a wiring layer stacked on the second semiconductor substrate and having a wiring electrically connected to the first through wire or the second through wire; and an adjustment layer that is provided on the second semiconductor substrate so as to be in contact with both or one of the first through wire and the second through wire and adjusts a capacitance between the transfer gate and the floating diffusion layer.

(2)

The solid-state imaging element according to (1), wherein the adjustment layer includes a diffusion layer provided on the second semiconductor substrate so as to be in contact with the first through wire, and a gate layer provided on the second semiconductor substrate so as to be in contact with the second through wire without being in contact with the diffusion layer.

(3)

The solid-state imaging element according to (1), wherein the adjustment layer includes a first diffusion layer provided on the second semiconductor substrate so as to be in contact with the first through wire, and a second diffusion layer provided on the second semiconductor substrate so as to be in contact with the second through wire without being in contact with the first diffusion layer.

(4)

The solid-state imaging element according to (1), wherein the adjustment layer includes a diffusion layer provided on the second semiconductor substrate so as to be in contact with the second through wire.

(5)

The solid-state imaging element according to (2), wherein the diffusion layer is formed by a same material as the floating diffusion layer.

(6)

The solid-state imaging element according to (2), wherein the gate layer is formed by a same material as the transfer gate.

(7)

The solid-state imaging element according to (3), wherein the first diffusion layer and the second diffusion layer are formed by a same material.

(8)

The solid-state imaging element according to (3), wherein the first diffusion layer and the second diffusion layer are formed by a same material as the floating diffusion layer.

(9)

The solid-state imaging element according to (4), wherein the diffusion layer is formed by a same material as the floating diffusion layer.

(10)

An electronic device, comprising a solid-state imaging element, wherein the solid-state imaging element includes a first semiconductor substrate, a second semiconductor substrate stacked on the first semiconductor substrate with an insulating layer interposed therebetween, a photoelectric conversion element that is provided on the first semiconductor substrate and generates charge by photoelectric conversion, a floating diffusion layer that is provided on the first semiconductor substrate and retains the charge generated by the photoelectric conversion element, a transfer gate that is a gate electrode of a transfer transistor that is provided on the first semiconductor substrate and transfers the charge generated by the photoelectric conversion element to the floating diffusion layer, a first through wire electrically connected to the floating diffusion layer and penetrating the insulating layer and the second semiconductor substrate, a second through wire electrically connected to the transfer gate and penetrating the insulating layer and the second semiconductor substrate, a wiring layer stacked on the second semiconductor substrate and having a wiring electrically connected to the first through wire or the second through wire, and an adjustment layer that is provided on the second semiconductor substrate so as to be in contact with both or one of the first through wire and the second through wire and adjusts a capacitance between the transfer gate and the floating diffusion layer.

(11)

An electronic device including the solid-state imaging element according to any one of (1) to (9).

REFERENCE SIGNS LIST

1 SOLID-STATE IMAGING ELEMENT
10 FIRST SUBSTRATE
11 FIRST SEMICONDUCTOR SUBSTRATE
12 SENSOR PIXEL
13 PIXEL REGION
20 SECOND SUBSTRATE
20*a* SEMICONDUCTOR LAYER
20*b* SEMICONDUCTOR LAYER
21 SECOND SEMICONDUCTOR SUBSTRATE
22 READOUT CIRCUIT
23 PIXEL DRIVE LINE
24 VERTICAL SIGNAL LINE
30 THIRD SUBSTRATE
31 THIRD SEMICONDUCTOR SUBSTRATE

32 LOGIC CIRCUIT
33 VERTICAL DRIVE CIRCUIT
34 COLUMN SIGNAL PROCESSING CIRCUIT
35 HORIZONTAL DRIVE CIRCUIT
36 SYSTEM CONTROL CIRCUIT
40 COLOR FILTER
42 p-WELL LAYER
43 ELEMENT ISOLATION SECTION
46 INSULATING LAYER
50 LIGHT RECEIVING LENS
51 INTERLAYER INSULATING FILM
52 INSULATING LAYER
53 INSULATING LAYER
54 INSULATING LAYER
55 CONNECTION WIRING
56 WIRING LAYER
57 INSULATING LAYER
58 PAD ELECTRODE
59 CONNECTION SECTION
61 INTERLAYER INSULATING FILM
62 WIRING LAYER
63 INSULATING LAYER
64 PAD ELECTRODE
71 FIRST THROUGH WIRE
72 SECOND THROUGH WIRE
74 DIFFUSION LAYER
75 GATE LAYER
76 DIFFUSION LAYER
77 GATE ELECTRODE
300 IMAGING DEVICE
301 DETECTION OPTICAL SYSTEM
302 SHUTTER DEVICE
303 IMAGING ELEMENT
304 CONTROL CIRCUIT
305 SIGNAL PROCESSING CIRCUIT
306 MONITOR
307 MEMORY
AMP AMPLIFICATION TRANSISTOR
FD FLOATING DIFFUSION
PD PHOTODIODE
RST RESET TRANSISTOR
SEL SELECTION TRANSISTOR
TG TRANSFER GATE
TR TRANSFER TRANSISTOR

The invention claimed is:

1. A solid-state imaging element, comprising:

a first semiconductor substrate;

a second semiconductor substrate stacked on the first semiconductor substrate with an insulating layer interposed therebetween;

a photoelectric conversion element that is provided on the first semiconductor substrate and generates charge by photoelectric conversion;

a floating diffusion layer that is provided on the first semiconductor substrate and retains the charge generated by the photoelectric conversion element;

a transfer gate that is a gate electrode of a transfer transistor that is provided on the first semiconductor substrate and transfers the charge generated by the photoelectric conversion element to the floating diffusion layer;

a first through wire electrically connected to the floating diffusion layer and penetrating the insulating layer and the second semiconductor substrate;

a second through wire electrically connected to the transfer gate and penetrating the insulating layer and the second semiconductor substrate;

a wiring layer stacked on the second semiconductor substrate and having a wiring electrically connected to the first through wire or the second through wire; and an adjustment layer that is provided on the second semiconductor substrate so as to be in contact with both or one of the first through wire and the second through wire and adjusts a capacitance between the transfer gate and the floating diffusion layer.

2. The solid-state imaging element according to claim 1, wherein the adjustment layer includes a diffusion layer provided on the second semiconductor substrate so as to be in contact with the first through wire, and a gate layer provided on the second semiconductor substrate so as to be in contact with the second through wire without being in contact with the diffusion layer.

3. The solid-state imaging element according to claim 1, wherein the adjustment layer includes a first diffusion layer provided on the second semiconductor substrate so as to be in contact with the first through wire, and a second diffusion layer provided on the second semiconductor substrate so as to be in contact with the second through wire without being in contact with the first diffusion layer.

4. The solid-state imaging element according to claim 1, wherein the adjustment layer includes a diffusion layer provided on the second semiconductor substrate so as to be in contact with the second through wire.

5. The solid-state imaging element according to claim 2, wherein the diffusion layer is formed by a same material as the floating diffusion layer.

6. The solid-state imaging element according to claim 2, wherein the gate layer is formed by a same material as the transfer gate.

7. The solid-state imaging element according to claim 3, wherein the first diffusion layer and the second diffusion layer are formed by a same material.

8. The solid-state imaging element according to claim 3, wherein the first diffusion layer and the second diffusion layer are formed by a same material as the floating diffusion layer.

9. The solid-state imaging element according to claim 4, wherein the diffusion layer is formed by a same material as the floating diffusion layer.

10. An electronic device, comprising a solid-state imaging element, wherein the solid-state imaging element includes a first semiconductor substrate, a second semiconductor substrate stacked on the first semiconductor substrate with an insulating layer interposed therebetween, a photoelectric conversion element that is provided on the first semiconductor substrate and generates charge by photoelectric conversion, a floating diffusion layer that is provided on the first semiconductor substrate and retains the charge generated by the photoelectric conversion element, a transfer gate that is a gate electrode of a transfer transistor that is provided on the first semiconductor substrate and transfers the charge generated by the photoelectric conversion element to the floating diffusion layer, a first through wire electrically connected to the floating diffusion layer and penetrating the insulating layer and the second semiconductor substrate, a second through wire electrically connected to the transfer gate and penetrating the insulating layer and the second semiconductor substrate, a wiring layer stacked on the second semiconductor substrate and having a wiring electrically connected to the first through wire or the second through wire, and an adjustment layer that is provided on the second semiconductor substrate so as to be in contact with both or one of the first through wire and the second through wire and adjusts a capacitance between the transfer gate and the floating diffusion layer.

* * * * *